United States Patent
Otsuki et al.

(10) Patent No.: US 7,153,773 B2
(45) Date of Patent: Dec. 26, 2006

(54) TISIN FILM FORMING METHOD, DIFFUSION BARRIER TISIN FILM, SEMICONDUCTOR DEVICE, METHOD OF FABRICATING THE SAME AND TISIN FILM FORMING SYSTEM

(75) Inventors: Hayashi Otsuki, Kousai-Machi (JP); Kunihiro Tada, Nirasaki (JP); Kimihiro Matsuse, Inagi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/868,936

(22) Filed: Jun. 17, 2004

(65) Prior Publication Data

US 2004/0232467 A1 Nov. 25, 2004

Related U.S. Application Data

(62) Division of application No. 10/148,952, filed as application No. PCT/JP99/06898 on Dec. 9, 1999, now Pat. No. 6,919,273.

(51) Int. Cl.
*H01L 21/44* (2006.01)
*H01L 21/31* (2006.01)

(52) U.S. Cl. .................................. 438/683; 438/785

(58) Field of Classification Search ............... 438/682, 438/683, 685, 758, 778, 785
See application file for complete search history.

(56) References Cited

U.S. PATENT DOCUMENTS

| | | | |
|---|---|---|---|
| 5,731,220 A * | 3/1998 | Tsu et al. | 438/782 |
| 5,770,520 A * | 6/1998 | Zhao et al. | 438/653 |
| 5,933,365 A * | 8/1999 | Klersy et al. | 365/148 |
| 5,953,634 A | 9/1999 | Kajita et al. | |
| 5,963,834 A * | 10/1999 | Hatano et al. | 438/680 |
| 6,048,445 A | 4/2000 | Brain | |
| 6,114,256 A | 9/2000 | Bachli et al. | |
| 6,153,519 A | 11/2000 | Jain et al. | |
| 6,156,638 A | 12/2000 | Agarwal et al. | |
| 6,511,867 B1 * | 1/2003 | Lowrey et al. | 438/128 |
| 2001/0045660 A1 | 11/2001 | Tsubouchi et al. | |

FOREIGN PATENT DOCUMENTS

| | | |
|---|---|---|
| JP | 7-201738 | 8/1995 |
| JP | 8-18028 | 1/1996 |
| JP | 8-139092 | 5/1996 |
| JP | 10-150155 | 6/1998 |
| JP | 10-209081 | 8/1998 |
| JP | 10-256503 | 9/1998 |
| JP | 10-303395 | 11/1998 |
| JP | 10-312976 | 11/1998 |

(Continued)

OTHER PUBLICATIONS

International Search Report issued for PCT/JP99/06898 dated Mar. 28, 2000.
J.L. He "Microstructure and Properties of Ti-Si-N Films Prepared by Plasma-Enhanced Chemical Vapor Deposition" Materials Chemistry and Physics 44 (1996), pp. 9-16.

(Continued)

*Primary Examiner*—Scott B. Geyer
(74) *Attorney, Agent, or Firm*—Smith, Gambrell & Russell, LLP

(57) ABSTRACT

A TiSiN film is used as a barrier metal layer for a semiconductor device to prevent the diffusion of Cu. The TiSiN film is formed by a plasma CVD process or a thermal CVD process. $TiCl_4$ gas, a silicon hydride gas and $NH_3$ gas are used as source gases for forming the TiSiN film by the thermal CVD process. $TiCl_4$ gas, a silicon hydride gas, $H_2$ gas and $N_2$ gas are used as source gases for forming a TiSiN film by the plasma CVD process.

15 Claims, 20 Drawing Sheets

FOREIGN PATENT DOCUMENTS

| | | |
|---|---|---|
| JP | 11-54718 | 2/1999 |
| JP | 11-74508 | 3/1999 |
| JP | 11-150084 | 6/1999 |
| JP | 11-186261 | 7/1999 |
| JP | 11-204523 | 7/1999 |

OTHER PUBLICATIONS

E. Blanquet "Evaluation of LPCVD Me-Si-N (Me=Ta, Ti, W, Re) Diffusion Barriers for Cu Metallizations" Microelectronic Engineering 37/38 (1997) pp. 189-195.

* cited by examiner

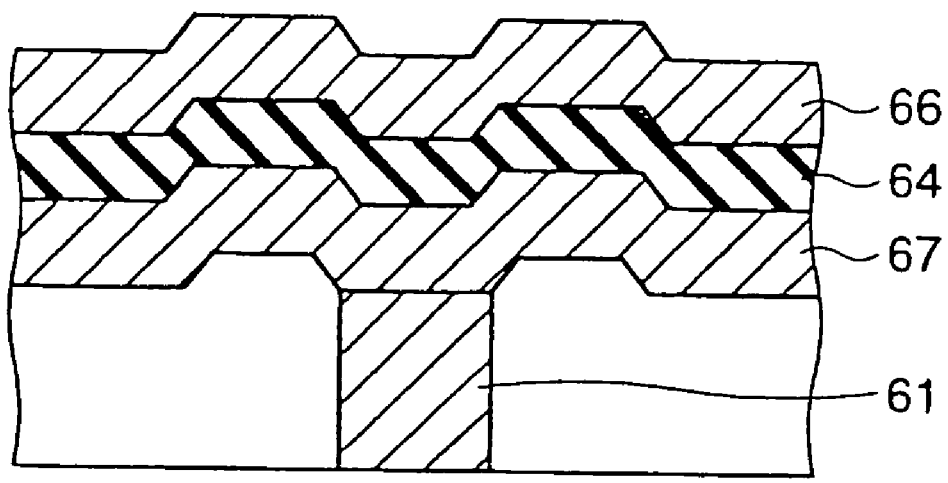
F I G. 7
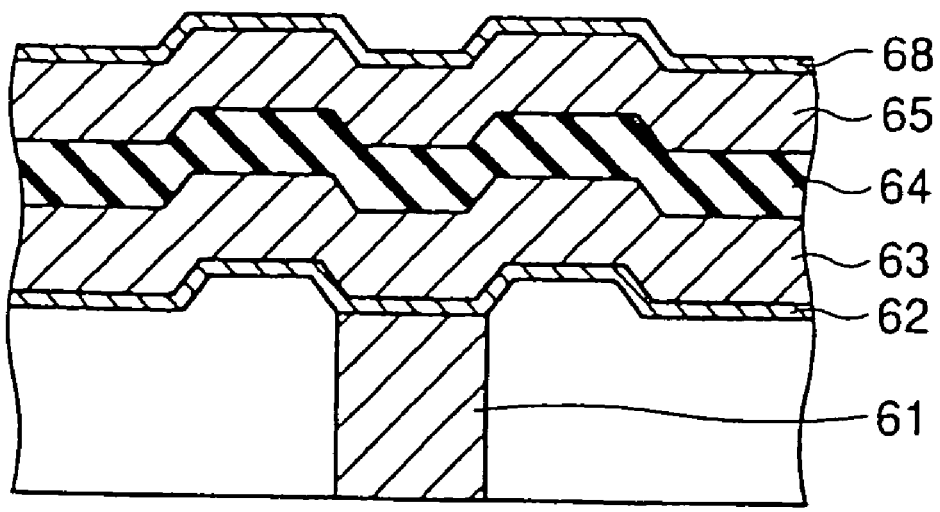
F I G. 8

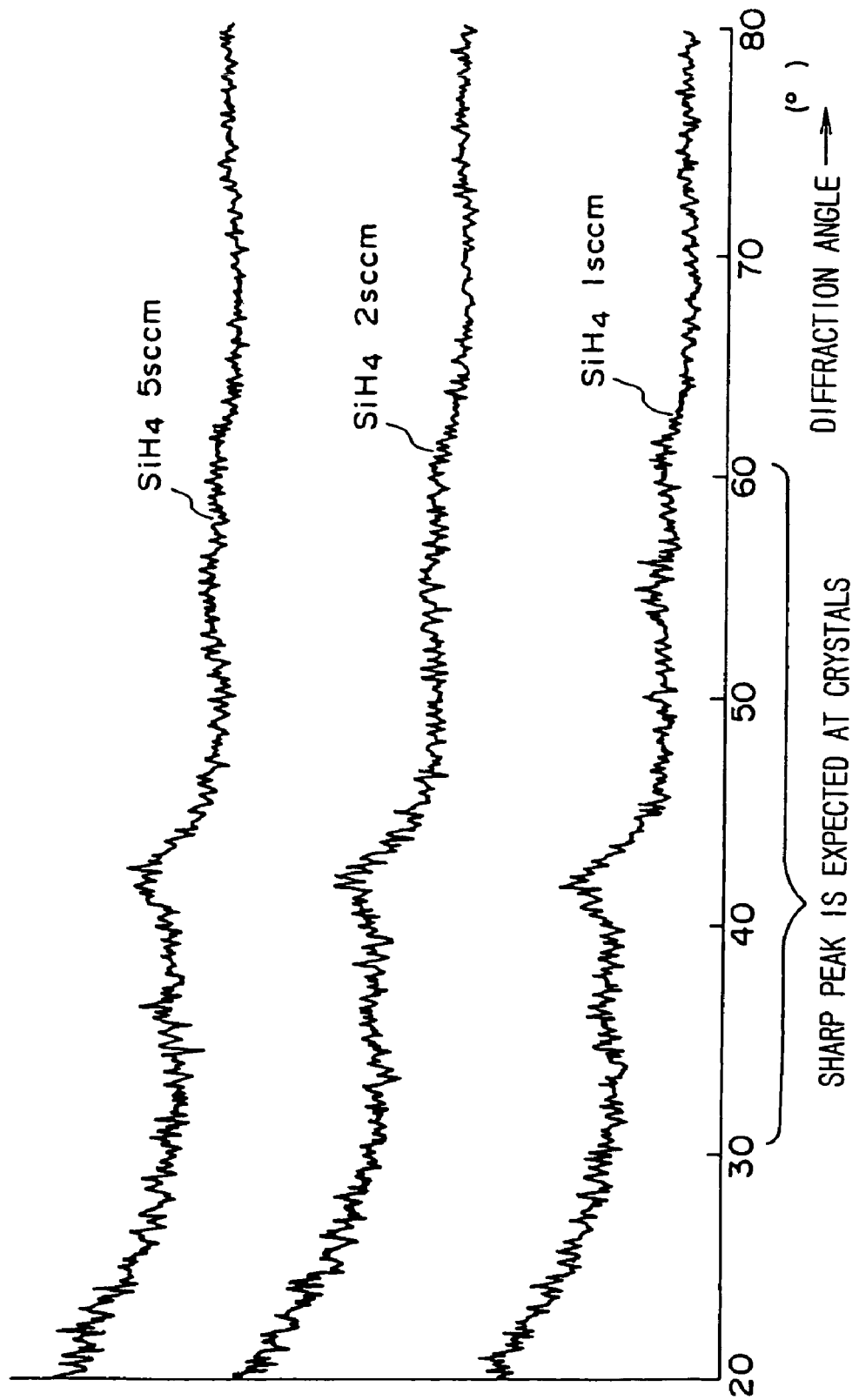
F I G. 21

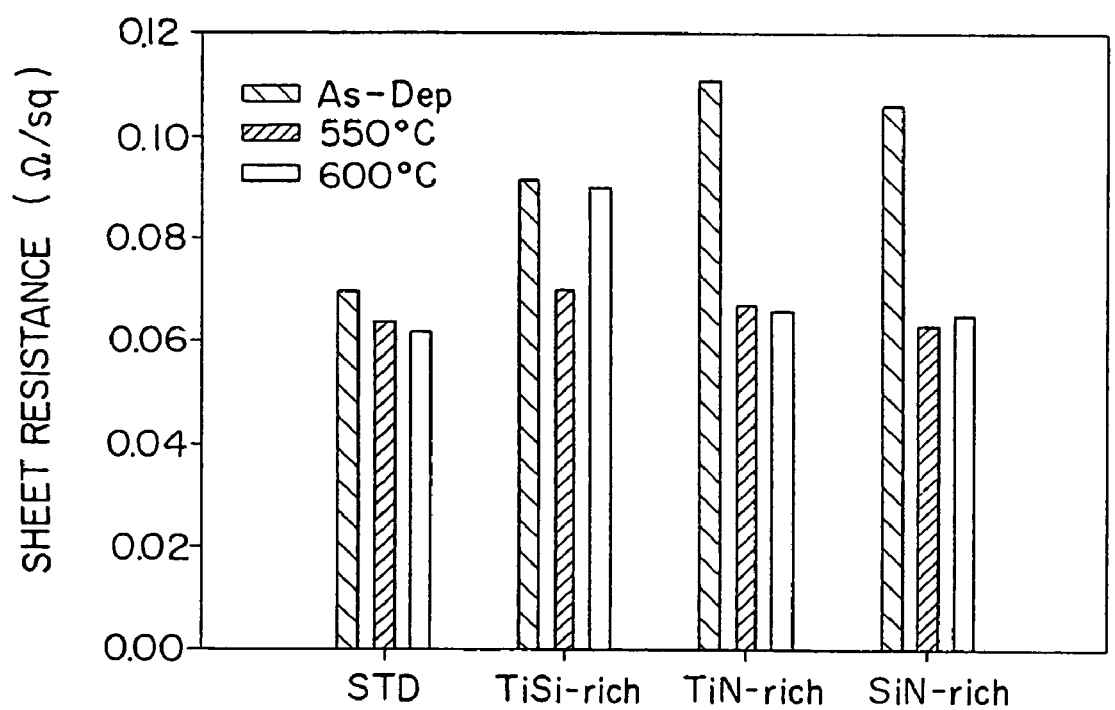
F I G. 24

TISIN FILM FORMING METHOD, DIFFUSION BARRIER TISIN FILM, SEMICONDUCTOR DEVICE, METHOD OF FABRICATING THE SAME AND TISIN FILM FORMING SYSTEM

This application is a divisional of application Ser. No. 10/148,952, filed Jun. 7, 2002 now U.S. Pat. No. 6,919,273, which is a National Stage Entry of PCT/JP99/06898, which was filed Dec. 9, 1999, which is incorporated herein by reference in its entirety.

TECHNICAL FIELD

The present invention relates to a barrier layer included in a semiconductor device, a method of forming the barrier layer, a semiconductor device provided with the barrier layer, and a method of fabricating the semiconductor device.

BACKGROUND ART

Generally, a substrate, such as a semiconductor wafer, is subjected repeatedly to film formation and pattern etching to form a plurality of desired elements on the substrate to fabricate a semiconductor integrated circuit.

Usually, a barrier metal layer is interposed between wiring lines interconnecting the elements and a layer underlying the wiring lines, such as the substrate or a Si-containing layer, to prevent the diffusion of silicon from the substrate or the Si-containing layer into the wiring lines and that of a material forming the wiring lines into the substrate or the Si-containing layer. The material of the barrier metal layer must have excellent corrosion resistance, not to mention low electrical resistance. Nitrides of metals having a high melting point, such as Ti (titanium), W (tungsten) and Mo (molybdenum), are used generally as barrier metals meeting the foregoing requirement when the wiring lines are aluminum wiring lines or tungsten wiring lines, which are used prevalently. There is a tendency to use Ti films or TiN films because of their satisfactory characteristics, such as electrical and corrosion-resistant properties.

A Ti film or a TiN film, as a barrier metal layer, is formed by a CVD process (chemical vapor deposition process) which is carried out in a high-temperature atmosphere of temperatures in the range of about 500° C. to 700° C., is capable of effectively filling up contact holes and via holes of a large aspect ratio, and has characteristics satisfactory for use in combination with aluminum or tungsten.

The width of wiring lines and the like has been diminished to meet the recent growth in the number of components per integrated circuit and the progressive miniaturization of integrated circuits. For example, the width of wiring lines desired in recent years is 0.2 μm or below. The enhancement of the operating speed of integrated circuits, as well as the increase of the number of components, has been intensely desired. Under such circumstances, comparatively inexpensive copper having a low resistivity has become a prospective wiring material capable of replacing aluminum.

However, as is generally known, copper (Cu), similarly to aluminum (Al), is liable to migrate into silicon and diffuses easily at low temperatures. Therefore, the performance of Ti or TiN barrier films used in combination with Cu wiring lines is unsatisfactory. Therefore, barrier metal layers of those barrier metals must be formed in a considerably large thickness to achieve a satisfactory barrier performance. If such a barrier metal layer having a large thickness is used in a multilayer integrated circuit device, in which wiring lines and a barrier metal layer must be formed in a section of a limited height, the sectional area of the wiring lines must be reduced accordingly. Consequently, the wiring lines have a high resistance. Thus, there has been a strong demand for the development of a barrier metal layer effective for use in combination with copper wiring lines.

DISCLOSURE OF THE INVENTION

The present invention has been made in view of the foregoing problems to provide means capable of effectively solving those problems.

It is a first object of the present invention to provide a diffusion preventing film as an effective barrier metal layer for use in combination with copper wiring lines. A second object of the present invention is to provide a semiconductor device employing this diffusion preventing film, and a method of fabricating the semiconductor device. A third object of the present invention is to provide a method of forming this diffusion preventing film.

With the foregoing object in view, the present invention provides a TiSiN-containing film forming method including the steps of: supplying source gases including a Ti-containing gas, a Si-containing gas and a N-containing gas into a chamber; and depositing a TiSiN-containing film on a heated substrate placed in the chamber by bringing the source gases into contact with the substrate by a thermal CVD process.

Preferably, at least one of $TiCl_4$, tetraxydimethylaminotitanium and tetraxydiethylaminotitanium is used as the Ti-containing gas. Preferably, at least one of $SiH_2Cl_2$, $SiHCl_3$, $SiCl_4$, $SiH_4$ and $Si_2H_6$ is used as the Si-containing gas. Preferably, at least either of $NH_3$ and monomethylhydrazine is used as the N-containing gas.

The present invention provides a TiSiN-containing film forming method including the steps of: supplying a Si-containing gas, $TiCl_4$ gas, $N_2$ gas and a reducing gas into a chamber, ionizing the Si-containing gas, the $TiCl_4$ gas, the $N_2$ gas and the reducing gas to produce a first plasma; forming a TiSiN-containing film on a substrate by using the first plasma; supplying a gas containing H and N into the chamber; producing a plasma from the gas containing H and N; and removing Cl from the TiSiN-containing film by processing the surface of the TiSiN-containing film with the second plasma.

Preferably, at least one of $SiH_2Cl_2$, $SiHCl_3$, $SiCl_4$, $SiH_4$ and $Si_2H_6$ is used as the Si-containing gas. Preferably, the reducing gas is $H_2$ gas or $NH_3$ gas. It is particularly preferable that the Si-containing gas is $SiH_4$ gas, and reducing gas is $H_2$ gas.

Preferably, the step of producing the first plasma heats the substrate at a temperature in the range of 350 to 450° C. Preferably, the pressure in the chamber is in the range of 0.5 to 5 Torr for the step of producing the first plasma. In the step of supplying a Si-containing gas, $TiCl_4$ gas, $N_2$ gas and a reducing gas into a chamber, it is preferable that $SiH_4$ gas, $TiCl_4$ gas, $N_2$ gas, $H_2$ gas and Ar gas are supplied at flow rates in the range of 0.1 to 10 sccm, in the range of 1 to 10 sccm, in the range of 30 to 500 sccm, in the range of 100 to 3000 sccm and in the range of 100 to 2000 sccm, respectively.

The TiSiN-containing film forming method may further include the step of cleaning the chamber or members disposed in the chamber with a $ClF_3$-containing gas after the step of forming the TiSiN-containing film on the substrate.

The present invention provides a diffusion preventing film including a TiSiN-containing film formed by a plasma CVD process or a thermal CVD process.

Preferably, the TiSiN-containing film formed by the plasma-assisted CVD process contains 10 to 40 atomic percent Ti, 10 to 40 atomic percent Si and 25 to 47 atomic percent N.

It is more preferable that the TiSiN-containing film contains 28 to 32 atomic percent Ti, 20 to 25 atomic percent Si and 28 to 32 atomic percent N. Preferably, films having this composition are formed by a high-pressure process using, for example, a process pressure of 3 Torr.

Preferably, the TiSiN-containing film contains 24 to 36 atomic percent Ti, 11 to 22 atomic percent Si and 44 to 46 atomic percent N. Preferably, films having this composition are formed by a low-pressure process using, for example, a process pressure of 0.6 Torr.

The TiSiN-containing film is interposed between a Si layer and a Cu layer, and can be used as a satisfactory barrier metal layer.

The present invention provides a semiconductor device provided with a capacitor portion, the capacitor portion including: an insulating layer of a material having a high dielectric constant; a lower electrode layer underlying the insulating layer, an upper electrode layer including a TiSiN-containing film formed on the insulating layer by a plasma-assisted CVD process or a thermal CVD process; and a barrier layer formed between the insulating layer and the lower electrode layer.

The present invention provides a semiconductor device provided with a capacitor portion, the capacitor portion including: an insulating layer of a material having a high dielectric constant; a lower electrode layer underlying the insulating layer; an upper electrode layer overlying the insulating layer; and a barrier layer of a TiSiN-containing film formed by a plasma-assisted CVD process or a thermal CVD process between the insulating layer and the lower electrode layer.

The present invention provides a semiconductor device provided with a capacitor portion, the capacitor portion including: an insulating layer of a material having a high dielectric constant; a lower electrode layer underlying the insulating layer; an upper electrode layer overlying the insulating layer; a barrier layer including a TiSiN-containing film formed by a plasma CVD process or a thermal CVD, and underlying the lower electrode layer; and a wiring layer underlying the barrier layer.

At least either the upper or the lower electrode layer may be formed of Pt or Ru.

The upper electrode layer may include a TiSiN film formed by a plasma CVD process or a thermal CVD process.

The semiconductor device may further include a barrier layer including a TiSiN-containing film formed on the upper electrode layer by a plasma CVD process or a thermal CVD process.

The present invention provides a semiconductor device provided with a capacitor portion, the capacitor portion including: an insulating layer formed of a material having a high dielectric constant; a lower electrode including a TiSiN film, and underlying the insulating layer; an upper electrode including a TiSiN-containing film formed by a plasma CVD process or a thermal CVD process, and overlying the insulating layer; a barrier layer underlying the lower electrode layer; and a wiring layer underlying the barrier layer.

The material having a high dielectric constant may be (Ba, Sr) TiO$_3$, Pb(Zr, Ti)O$_3$, Ta$_2$O$_5$ or RuO.

The present invention provides a semiconductor device including: a wiring layer; a buried wiring part for connecting the wiring layer, and a semiconductor substrate or a diffused layer formed in an upper part of the semiconductor substrate; and a barrier layer including a TiSiN-containing film formed between the buried wiring part, and the semiconductor substrate or the diffused layer formed in the upper part of the semiconductor substrate by a plasma CVD process or a thermal CVD process.

The present invention provides a semiconductor device including: a semiconductor substrate; and a gate electrode formed on an insulating layer formed on a major surface of the semiconductor substrate and connected to a wiring layer; wherein the gate electrode is a TiSiN-containing film formed by a plasma CVD process or a thermal CVD process.

The gate electrode may have a lower layer of a TiSiN-containing film formed by a plasma CVD process or a thermal CVD process, and an upper layer of W formed on the lower layer.

The gate electrode may include an insulating layer formed of (Ba, Sr)TiO$_3$, Pb(Zr, Ti)O$_3$, Ta$_2$O$_5$ or RuO on the semiconductor substrate; a barrier layer including a TiSiN film formed on the insulating layer; and a conductive layer formed on the barrier layer.

The semiconductor device may further include a SiO$_x$N$_y$ film formed between the semiconductor substrate and the insulating layer.

The present invention provides a semiconductor device fabricating method including a capacitor portion forming process including the steps of: forming a lower electrode layer; forming a barrier layer including a TiSiN-containing film on the lower electrode layer by a plasma CVD process or a thermal CVD process; forming an insulating layer of a material having a high dielectric constant on the barrier layer; and forming an upper electrode layer on the insulating layer.

The present invention provides a semiconductor device fabricating method including a capacitor portion forming process including the steps of: forming a lower electrode layer; forming a barrier layer on the lower electrode layer; forming an insulating layer of a material having a high dielectric constant on the barrier layer; and forming an upper electrode layer including a TiSiN-containing film on the insulating layer by a plasma CVD process or a thermal CVD process.

The present invention provides a semiconductor device fabricating method including a capacitor portion forming process including the steps of: forming a barrier layer including a TiSiN-containing film by a plasma CVD process or a thermal CVD process on a wiring layer formed on a semiconductor substrate; forming a lower electrode layer on the barrier layer; forming an insulating layer of a material having a high dielectric constant on the lower electrode layer; and forming an upper electrode layer on the insulating layer.

The present invention provides a semiconductor device fabricating method including a capacitor portion forming process including the steps of: forming a barrier layer of a TiSiN film on a wiring layer formed on a semiconductor substrate; forming a lower electrode layer on the barrier layer; forming an insulating layer of a material having a high dielectric constant on the lower electrode layer; and forming an upper electrode layer of a TiSiN-containing film on the insulating layer by a plasma CVD process or a thermal CVD process.

The present invention provides a semiconductor device fabricating method including a capacitor portion forming process including the steps of: forming a lower electrode layer including a TiSiN-containing film by a plasma CVD process or a thermal CVD process on a wiring layer formed on a semiconductor substrate; forming an insulating layer of a material having a high dielectric constant on the lower electrode layer; and forming an upper electrode layer of a TiSiN-containing film on the insulating layer by a plasma CVD process or a thermal CVD process.

The present invention provides a semiconductor device fabricating method including a buried wiring part forming process including the steps of: forming an insulating layer on a semiconductor substrate or on a conductive layer formed on the semiconductor substrate; forming contact holes or viaholes in the insulating layer by an etching process; forming a barrier layer including a TiSiN-containing film on the insulating layer, and the contact holes or the viaholes; and forming a wiring layer on the barrier layer.

The present invention provides a semiconductor device fabricating method including a gate electrode forming process including the steps of: forming a lower layer including a TiSiN-containing film by a plasma CVD process or a thermal CVD process on an insulating layer formed on a semiconductor substrate; and forming an upper layer of W on the lower layer.

The present invention provides a semiconductor device fabricating method including a gate electrode forming process including the steps of: forming an insulating layer of a material having a high dielectric constant on a semiconductor substrate; forming a barrier layer including a TiSiN-containing film by a plasma CVD process or a thermal CVD process on the insulating layer; and forming a conductive layer on the barrier layer.

The gate electrode forming process may further include the step of forming a $SiO_xN_y$ film between the semiconductor substrate and the insulating layer.

The present invention provides a film forming system including: a chamber for accommodating a substrate to be processed; a support member disposed in the chamber to support the substrate thereon; a source gas supply system for supplying source gasses into the chamber; and a heating mechanism for heating the substrate supported on the support member; wherein the gas supply system includes a Ti-containing gas supply, a Si-containing gas supply and a N-containing gas supply, and a TiSiN-containing film is deposited by a thermal CVD process on the substrate heated by the heating mechanism.

The above and other features of the present invention will become apparent from the following description taken in connection with the accompanying drawings.

BRIEF DESCRIPTION OF THE DRAWINGS

FIG. 7 is a sectional view of a fourth capacitor structure, such as a DRAM, employing a TiSiN film formed by a film forming method according to the present invention;

FIG. 8 is a sectional view of a fifth capacitor structure, such as a DRAM, employing a TiSiN film formed by a film forming method according to the present invention;

FIG. 21 is a graph showing the results of examination of TiSiN films for amorphousness by an x-ray diffraction method;

FIG. 24 is a graph showing the barrier properties of TiSiN films respectively having different compositions;

BEST MODE FOR CARRYING OUT THE INVENTION

Preferred embodiments of the present invention will be described hereinafter with reference to the accompanying drawings.

The present invention provides a film forming method including a thermal CVD process and a film forming method including a plasma-assisted CVD process. First, a film forming method including a thermal CVD process will be described.

TiSiN Film Formation by Thermal CVD Process

Figure 1:
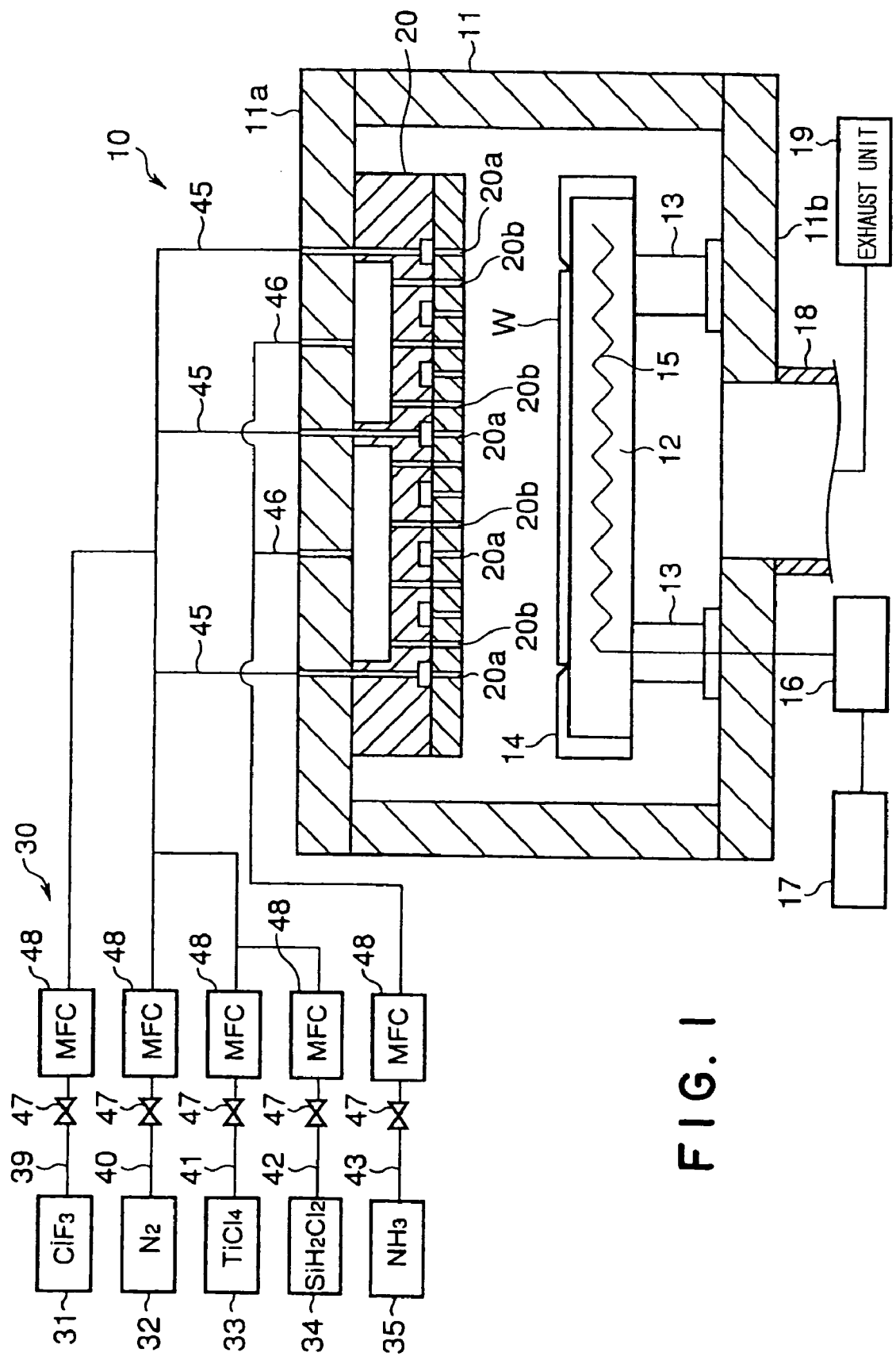
FIG. 1 is a typical sectional view of a thermal CVD system for forming a TiSiN film.

FIG. 1 is a sectional view of a thermal CVD system for forming a TiSiN-containing film (hereinafter, referred to simply as "TiSiN film") by a thermal CVD process. Although it is supposed in the following description that a substrate to be processed is a semiconductor wafer, the substrate may be of other type.

A thermal CVD system 10 has a substantially cylindrical, airtight chamber 11 (reactor vessel). A susceptor 12 is supported on cylindrical support members 13 in the chamber 11 to support a semiconductor wafer W, i.e., a workpiece, thereon in a horizontal position. A guide ring 14 for guiding the semiconductor wafer W is put on a peripheral part of the susceptor 12. A heater 15 is embedded in the susceptor 12. Power is supplied to the heater 15 by a power source 16 to heat the semiconductor wafer W, i.e., a workpiece, at a predetermined temperature. A controller 17 is connected to the power source 16 to control the output of the heater 15 according to a signal provided by a temperature sensor, not shown.

A showerhead 20 is held on a top wall 11a of the chamber 11 to supply source gases through the showerhead 20 into the chamber 11.

Source gases are a Ti-containing gas, a Si-containing gas and a N-containing gas. $TiCl_4$, tetraxydimethylaminotitanium (TDMAT) and tetraxydiethylaminotitanium (TDEAT) are examples of the Ti-containing gas. $SiH_2Cl_2$, $SiHCl_3$, $SiCl_4$, $SiH_4$ and $Si_2H_6$ are examples of the Si-containing gas. $NH_3$ and monomethylhydrazine (MMH) are examples of the N-containing gas. The thermal CVD system shown in FIG. 1 employs $TiCl_4$, $SiH_2Cl_2$ and $NH_3$ as the Ti-containing gas, the Si-containing gas and the N-containing gas, respectively. The following description will be made on an assumption that the foregoing gases are used.

The showerhead 20 is provided with a plurality of gas discharge holes 20a and 20b, which are arranged alternately. The source gases are discharged through the gas discharge holes 20a and 20b toward the susceptor 12. Pipes included in the gas supply mechanism are connected to the showerhead 20. The gas discharge holes 20a is connected to a $TiCl_4$ gas supply pipe 45. The gas discharge holes 20b are connected to a $NH_3$ gas supply pipe 46. The source gases are supplied through the showerhead 20 into the chamber 11. The showerhead 20 is of a matrix type. $TiCl_4$ gas, $NH_3$ gas and $SiH_2Cl_2$ gas are discharged through the alternately arranged different gas discharge holes, and those gases are mixed after being discharged from the holes (a post-mixing system).

The gas supply mechanism 30 has a $ClF_3$ gas supply 31 for supplying $ClF_3$ gas, i.e., a cleaning gas, a $N_2$ gas supply 32 for supplying $N_2$, a $TiCl_4$ gas supply 33 for supplying $TiCl_4$, a $SiH_2Cl_2$ gas supply 34, and a $NH_3$ gas supply 35 for supplying $NH_3$. Gas lines 39, 40, 41, 42 and 43 are connected to the $ClF_3$ gas supply 31, the $N_2$ gas supply 32, the $TiCl_4$ gas supply 33, the $SiH_2Cl_2$ gas supply 34, and the $NH_3$ gas supply 35, respectively. Each of the gas lines 39 to 43 is provided with a valve 47 and a mass-flow controller 48.

The gas line 40 connected to the $N_2$ gas supply is connected to the gas line 41 connected to the $TiCl_4$ gas supply 33. $N_2$ gas flows through the gas line 40 and the pipe 45 to carry $TiCl_4$ gas into the showerhead 20. $TiCl_4$ gas carried by $N_2$ gas is introduced through the gas discharge holes 20a into the chamber 11. The gas line connected to the $ClF_3$ supply 31 is connected to the gas line 40. When the valve 47 placed in the gas line 39 is opened, $ClF_3$ gas, i.e., a cleaning gas, flows through the gas lines 39 and 40 and the pipe 45 into the showerhead 20, and is introduced through the gas discharge openings 20a into the chamber 11. $NH_3$ gas supplied from the $NH_3$ gas supply 35 flows through the gas line 43 and the pipe 46 into the showerhead 20, and is introduced through the gas discharge holes 20b into the chamber 11. The gas line connected to the $SiH_2Cl_2$ supply 34 is connected to the gas line 41. $SiH_2Cl_2$ gas flows through the gas lines 42, 41 and 40 and the pipe 45 into the showerhead 20, and is introduced through the gas discharge holes 20a into the chamber 11. The $TiCl_4$ supply 33, the lines connecting the $TiCl_4$ supply 33 to the chamber 11, and the mass-flow controller 48 are heated by a heating means, not shown, to prevent the condensation of $TiCl_4$ gas. The top and the side walls of the chamber 11 are heated. $N_2$ gas serving as a carrier gas may be replaced with Ar gas or the like.

An exhaust pipe 18 has one end connected to the bottom wall 11b of the chamber 11 and the other end connected to an exhaust unit 19 including a vacuum pump. The exhaust unit 19 is capable of evacuating the chamber 11 to a predetermined vacuum.

A method of forming a TiSiN film on the semiconductor wafer W by this thermal CVD system will be described by way of example.

The semiconductor wafer W is loaded into the chamber 11. The wafer W is heated by the heater 15, while the chamber 11 is evacuated by the exhaust unit 19 to a high vacuum. Subsequently, $N_2$ gas and $NH_3$ gas are supplied at predetermined flow rates, respectively, into the chamber 11 to keep the interior of the chamber 11 at a pressure in the range of, for example, 133.3 to 1333.2 Pa (1 to 10 Torr). Thus, the semiconductor wafer W is preannealed under the foregoing conditions.

Then, the interior of the chamber 11 is set at a predetermined pressure for film formation, the predetermined flow rates of $N_2$ gas and $NH_3$ gas are maintained, $TiCl_4$ gas and $SiH_2Cl_2$ gas are supplied at predetermined flow rates, respectively, for about 2 to 5 seconds for preflowing. Then, a TiSiN film forming process is continued for a predetermined time under the same conditions as preflowing.

The following are preferred film forming conditions.
Process pressure: 40.0 to 666.6 Pa (0.3 to 5 Torr)
Temperature of wafer: 400 to 650° C.
Flow rate of $TiCl_4$ gas: $3.0 \times 10^{-4}$ to $3.0 \times 10^{-3}$ m$^3$/sec (5 to 50 sccm)
Flow rate of $NH_3$ gas: $3.0 \times 10^{-3}$ to $3.0 \times 10^{-2}$ m$^3$/sec (50 to 500 sccm)
Flow rate of $SiH_2Cl_2$ gas: $3.0 \times 10^{-4}$ to $3.0 \times 10^{-2}$ m$^3$/sec (5 to 500 sccm)

A TiSiN film can be formed over stepped parts in satisfactory step coverage by the thermal CVD process. Since the thermal CVD process, differing from a plasma-assisted CVD process, deposits a film by surface reaction, the TiSiN film thus deposited has excellent step coverage, inherently. Therefore, the TiSiN film may be thin, which contributes to device miniaturization.

Figure 2:
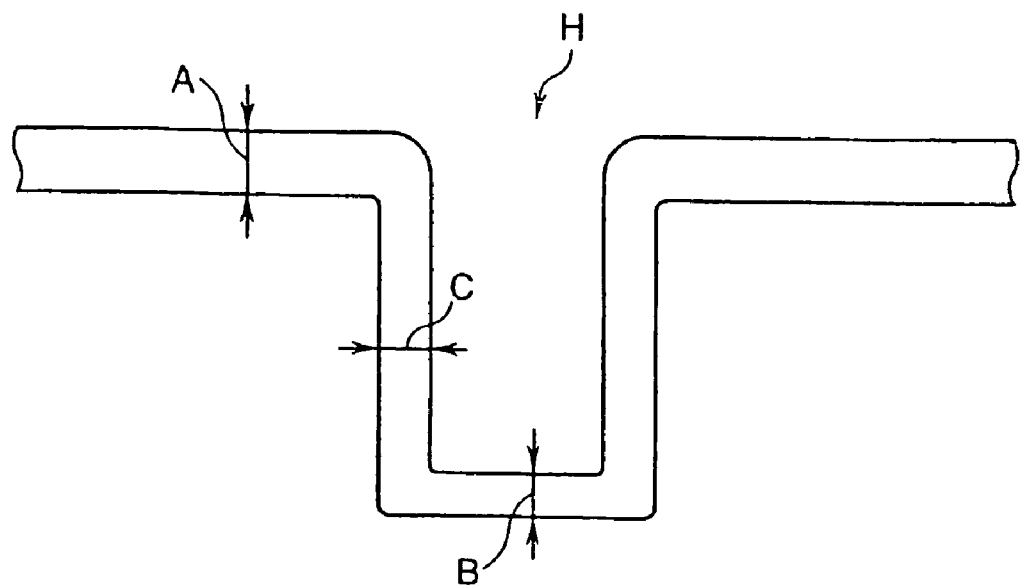
FIG. 2 is a typical view of assistance in explaining a method of evaluating step coverage.

Regarding a hole H shown in FIG. 2, the step coverage of the TiSiN film is evaluated by bottom coverage B/A and side coverage C/A, where A is the thickness of the TiSiN film covering the surface of the wafer W other than the hole H, B is the thickness of the TiSiN film covering the bottom of the hole H, and C is the thickness of the TiSiN film covering the side surface of the hole H.

More concretely, the TiSiN film formed on the surface of a wafer having a hole of an opening size in the range of about 0.1 to about 0.2 µm and a depth of about 0.5 µm by the thermal CVD process had both bottom and side coverages of 90% or above, while a TiSiN film formed by an ordinary plasma-assisted CVD process on the same surface had bottom and side coverages in the range of 20 to 30%. Although the process temperature of the thermal CVD process is higher than that of an ordinary plasma-assisted CVD process in forming the TiSiN film, it was found that the TiSiN film formed by the thermal CVD process has excellent film quality.

After the completion of formation of the TiSiN film, the semiconductor wafer W is unloaded from the chamber 11, and $N_2$ gas (or Ar gas) and $ClF_3$ gas, i.e., a cleaning gas, are supplied into the chamber 11 for cleaning.

Preferable Cleaning Conditions are as follows:

Temperature: 200 to 500° C. (Preferably, 200° C.)

Process pressure: 0.5 to 5 Torr (More preferably, 3 Torr)

Flow rate of $ClF_3$ gas: 100 to 500 sccm (More preferably, 200 sccm)

Flow rate of $N_2$ gas (Ar gas): 100 to 500 sccm (More preferably, 200 sccm)

The TiSiN film can be easily removed by cleaning using $ClF_3$ gas. Particle production can be suppressed by periodically cleaning the interior of the reaction vessel with $ClF_3$ gas every time a proper number of wafers are processed by the film forming process and films of high film quality can be formed. The cleaning process using $ClF_3$ gas is also effective in removing TiSiN films formed by a plasma-assisted process, which will be described later.

Examples of application of the TiSiN film will be described. In the following examples, TiSiN films can be formed by the foregoing method. Layers other than those of the TiSiN film can be formed by publicly known processes unless otherwise specified.

Figure 3:
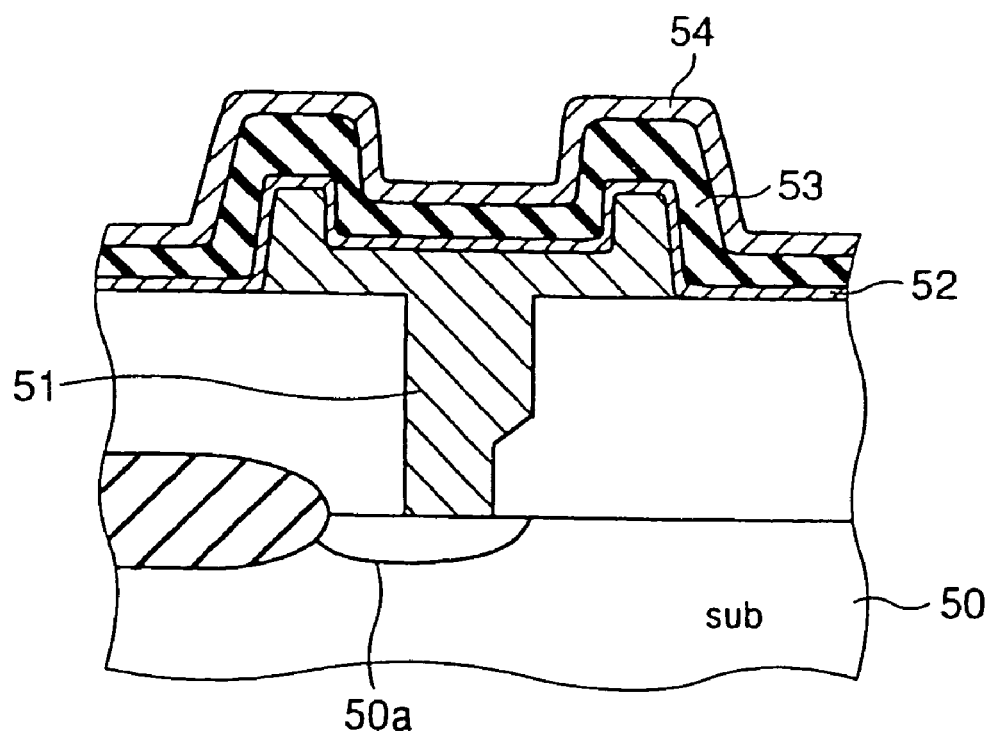
FIG. 3 is a sectional view of a capacitor structure, such as a DRAM, employing a TiSiN film formed by a film forming method according to the present invention.

FIG. 3 is a sectional view of a MIS capacitor (metal-insulator-semiconductor capacitor) provided with the TiSiN film and included in a DRAM or the like. A lower electrode layer 51 of amorphous Si is connected to an impurity-diffused region 50a in a Si substrate 50. The lower electrode layer 51 is covered with a SiN barrier layer 52 formed by processing a Si film by an RTN (rapid thermal nitriding) process. An insulating layer 53 of a material having a high dielectric constant, such as BST, Pb(Zr, Ti)O$_3$ (PZT), Ta$_2$O$_5$ or RuO, is formed on the SiN barrier layer 52. An upper electrode layer of a TiSiN film is formed on the insulating layer 53. A metal wiring layer, not shown, is formed on the upper electrode layer 54.

A conventional upper electrode layer 54 is a TiN film. When the Si substrate 50 provided with those layers is subjected to a heat treatment later, O of Ta$_2$O$_5$ diffuses into the TiN film to produce TiO. Consequently, the thickness of the TiN film decreases, the thickness of the Ta$_2$O$_5$ film increases and capacitance is reduced. This problem can be solved by using a TiSiN film as the upper electrode layer 54.

Figure 4:
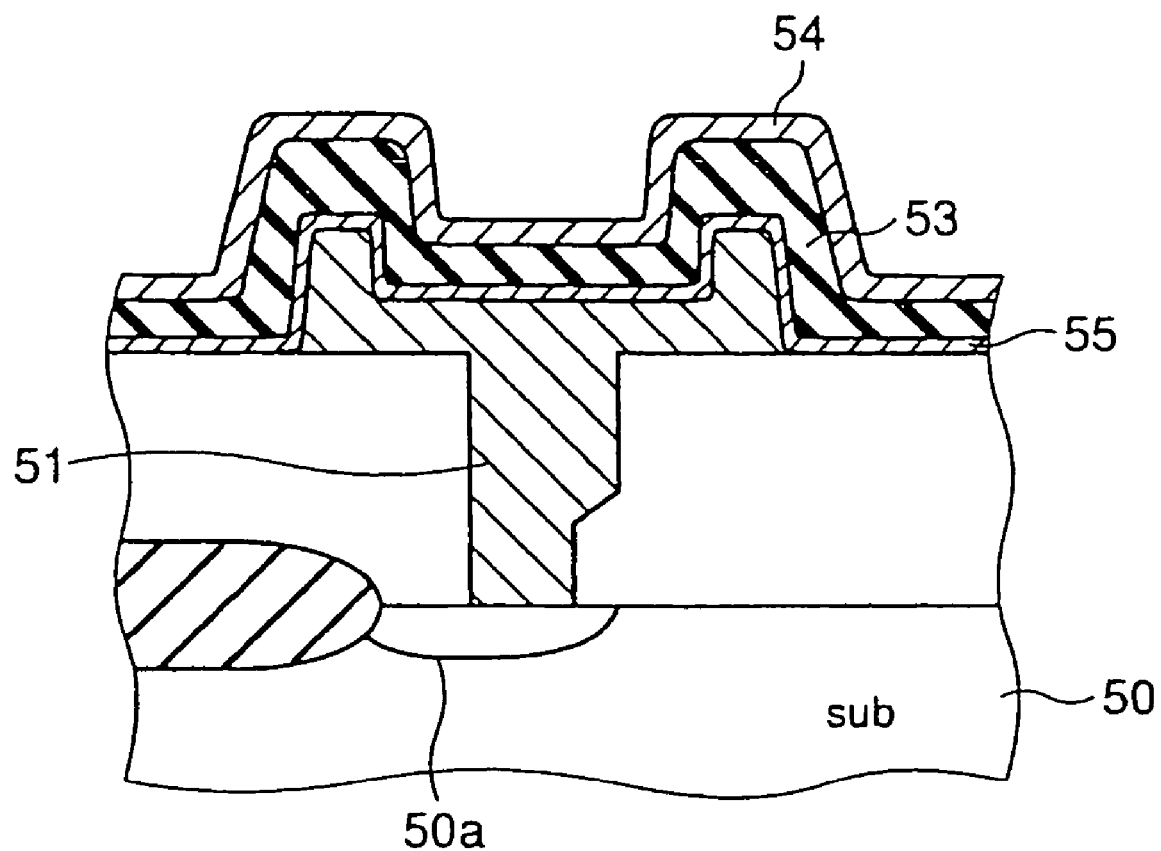
FIG. 4 is a sectional view of a capacitor structure, such as a DRAM, employing a TiSiN film formed by a film forming method according to the present invention.

A structure shown in FIG. 4 is basically the same as that shown in FIG. 3, except that the structure shown in FIG. 4 is provided with a TiSiN barrier layer 55 of a TiSiN film formed on a lower electrode layer 51 instead of the SiN barrier layer 52. The TiSiN barrier layer exercises an enhanced barrier effect in preventing diffusion between the lower electrode layer 51 and the insulating layer 53.

Figure 5:
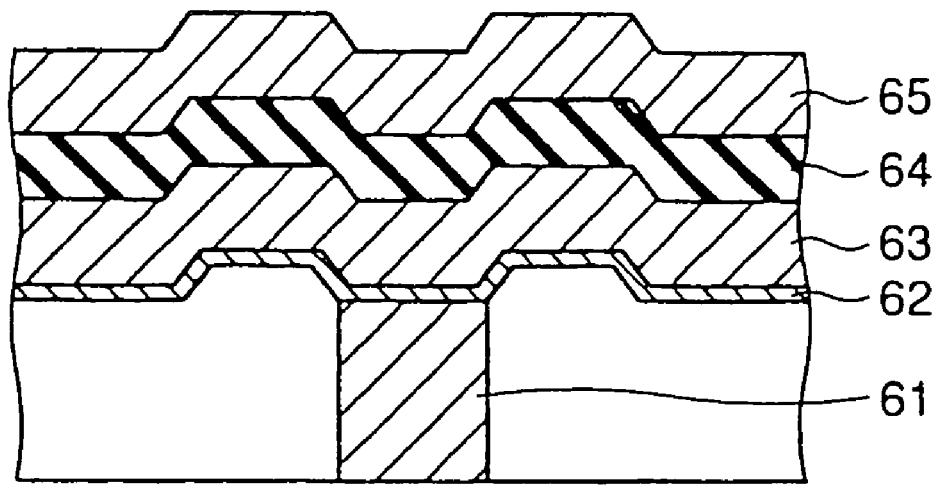
FIG. 5 is a sectional view of another capacitor structure, such as a DRAM, employing a TiSiN film formed by a film forming method according to the present invention.

FIG. 5 is a sectional view of a MIM capacitor (metal-insulator-metal capacitor) provided with the TiSiN film formed by the thermal CVD process of the present invention, and included in a DRAM or the like. A barrier layer 62 of a TiSiN film is formed on a poly-Si plug (wiring layer) 61 connected to an impurity-diffused region of a Si substrate. A lower electrode 63 of Pt, Ru or the like, an insulating layer 64 of a material having a high dielectric constant, such as BST, Pb(Zr, Ti)O$_3$ (PZT), Ta$_2$O$_5$ or RuO, and an upper electrode 65 of Pt, Ru or the like are formed in that order on the barrier layer 62.

The insulating layer 64 of the material having a high dielectric constant enables the formation of a capacitor having a large capacity for the DRAM and reduces leakage current density, and Pt or Ru forming the electrodes reduces leakage current density, which contributes to increasing the density and the number of the components of the semiconductor device. The electrodes formed of the metal, such as Pt or Ru, and not of Si enhances operating speed. The TiSiN barrier layer 62 is capable of effectively preventing reaction between the lower electrode 63 and the poly-Si plug 61 underlying the lower electrode 63, and of blocking the diffusion of oxygen into the poly-Si plug 61 during the formation of the insulating layer 64 to prevent the oxidation of the poly-Si plug 61 and the resultant increase in resistance.

Figure 6:
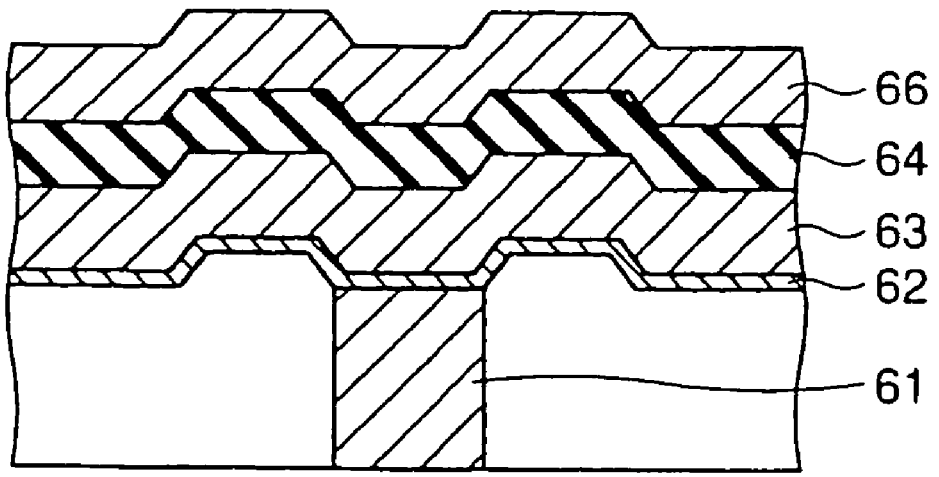
FIG. 6 is a sectional view of a third capacitor structure, such as a DRAM, employing a TiSiN film formed by a film forming method according to the present invention.

FIG. 6 shows a MIM capacitor provided with an upper electrode 66 of a TiSiN film instead of the upper electrode 65 of Pt, Ru or the like of the capacitor shown in FIG. 5. FIG. 7 shows a MIM capacitor provided with an upper electrode 66 similar to the upper electrode 66 of the capacitor shown in FIG. 6, and a lower electrode 67 of a TiSiN film instead of the lower electrode 63 of Pt, Ru or the like of the capacitor shown in FIG. 5. Since the capacitor shown in FIG. 7 is provided with the lower electrode 67 of a TiSiN film having an excellent barrier function, any layer corresponding to the barrier layer 62 is not necessary, which is effective in the miniaturization of the semiconductor device.

In the structure shown in FIG. 5, a TiSiN barrier layer 68 may be formed over the upper electrode 65 as shown in FIG. 8 with a view to surely preventing reaction between the upper electrode 65 and the wiring layer, not shown, formed on the upper electrode 65.

Figure 9:
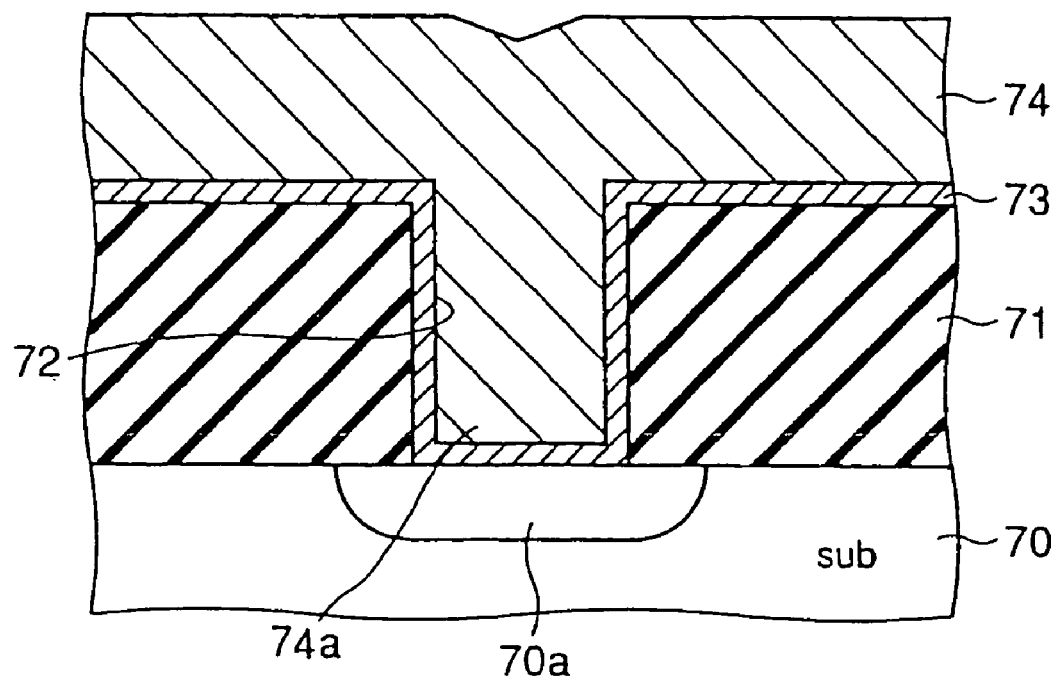
FIG. 9 is a sectional view of a sixth capacitor structure, such as a DRAM, employing a TiSiN film formed by a film forming method according to the present invention.

FIG. 9 is a sectional view of a structure provided with a contact part of a TiSiN film of a wiring layer. A layer insulating film 71 is formed on a Si substrate 70. A contact hole 72 is formed in the layer insulating film 71 so as to reach an impurity-diffused region 70a formed in the Si substrate 70. A barrier layer 73 of a TiSiN film is formed on the layer insulating film 71 so as to cover the bottom and side surfaces of the contact hole 72. A metal wiring layer 74 of W (tungsten) is formed on the barrier layer 73 so as to fill up the contact hole 72 to form a buried wiring part 74a. The impurity-diffused region 70a of the Si substrate 70 is connected electrically to the metal wiring layer 74. The TiSiN film, having barrier ability higher than that of the conventional TiN thin film, is capable of very effectively preventing the production of a chemical compound through reaction between W (tungsten) forming the metal wiring layer 74, and Si contained in the layer underlying the metal wiring layer 74. The TiSiN film can be used as a barrier layer in combination with wiring layers of other materials, such as Cu and Al wiring layers.

Figure 10:
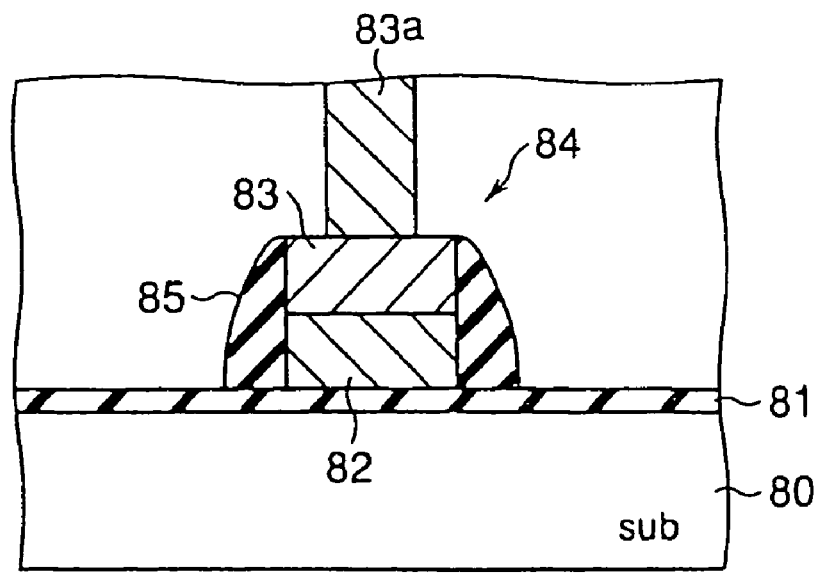
FIG. 10 is a sectional view of a TiSiN film formed by a method according to the present invention and used as a contact part for a metal wiring layer.

FIG. 10 shows a gate electrode 84 formed from a TiSiN film. The gate electrode 84 has a lower layer 82 of a TiSiN film formed by a thermal CVD process on an insulating film 81 formed on a Si substrate 80, and an upper layer 83 of a tungsten thin film. A W (tungsten) wiring layer 86 is formed on the upper layer 83. Indicated at 85 is a spacer of SiN. The TiSiN film forming the gate electrode 84 has a low resistivity and an excellent barrier property, and is stable under heat. Thus, the gate electrode 84 has an excellent characteristic.

Figure 11:
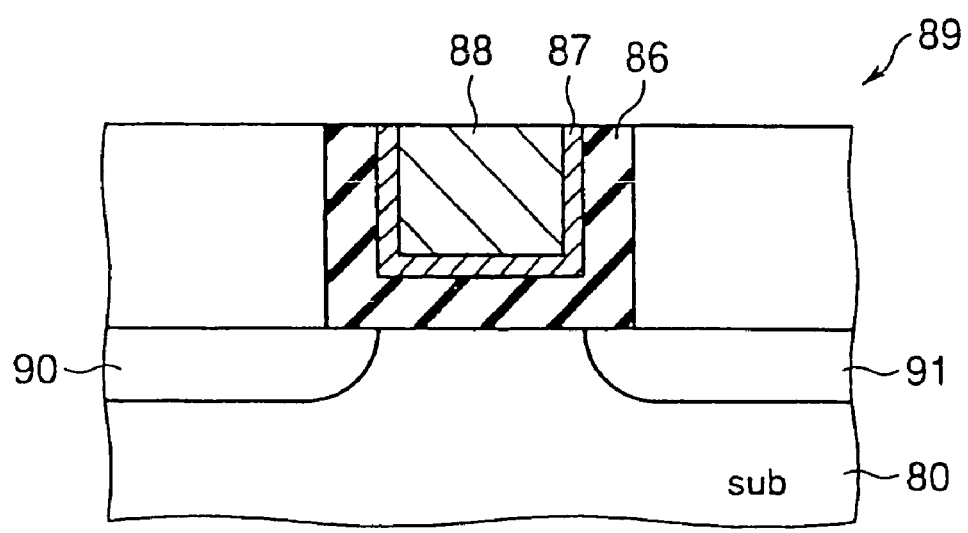
FIG. 11 is a sectional view of a gate electrode including a TiSiN film formed by a method according to the present invention.

FIG. 11 shows a gate electrode 89. An insulating layer 86 of a material having a high dielectric constant, such as BST, Pb(Zr, Ti)O$_3$ (PZT), Ta$_2$O$_5$ or RuO, is formed on a Si substrate 80. The gate electrode 89 is formed by forming a barrier layer 87 of a TiSiN film on the insulating layer 86, and forming an upper layer 88 of Al or W on the barrier layer 87. In FIG. 11, indicated at 90 and 91 are a source and a drain, respectively.

Figure 12:
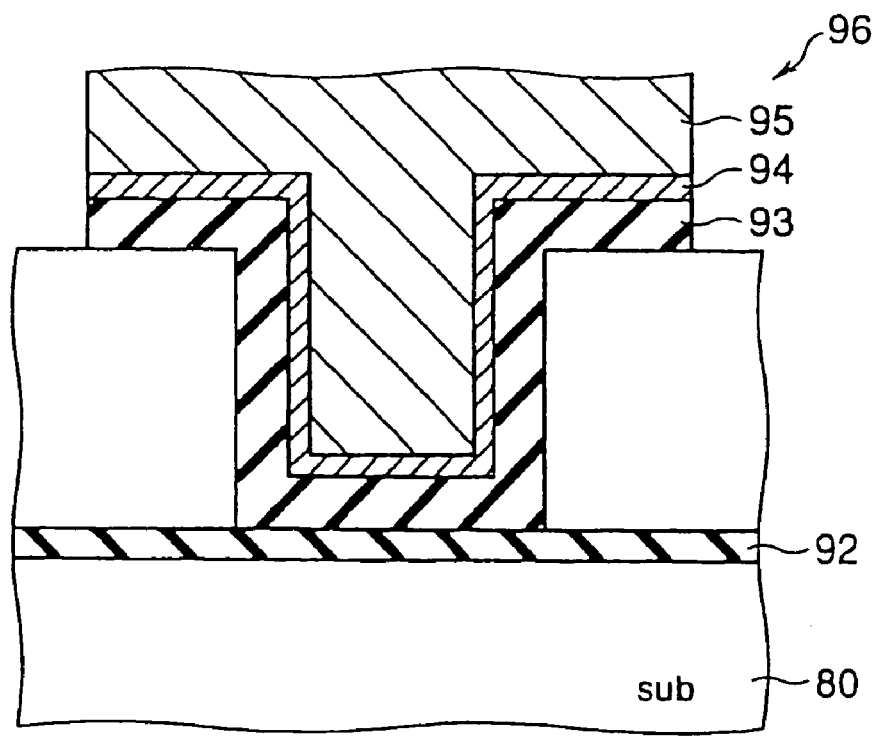
FIG. 12 is a sectional view of another gate electrode including a TiSiN film formed by a method according to the present invention.

FIG. 12 shows a gate electrode 96. A SiO$_x$N$_y$ thin film 92 is formed on a Si substrate 80, an insulating layer 93 of a material having a high dielectric constant, such as BST, Pb(Zr, Ti)O$_3$ (PZT), Ta$_2$O$_5$ or RuO, is formed on the SiO$_x$N$_y$ thin film 92, a barrier layer 94 of a TiSiN film is formed on the insulating film 93, and an upper layer 95 of W or Al is formed on the barrier layer 94 to complete the gate electrode 96. These structures are capable of enhancing operating speed. The barrier layers 87 and 94 of a TiSiN film is capable of effectively preventing mutual diffusion between the upper layers 88 and 95 of a material having a high dielectric constant, and the insulating layers 86 and 93. If an insulating layer is formed directly on the Si substrate 80 in the structure shown in FIG. 11, interface control is difficult and defects are formed in the interface. Such a trouble can be avoided by forming a SiO$_x$N$_y$ thin film 92 between the Si substrate 80 and an insulating film 93 as shown in FIG. 12. The SiO$_x$N$_y$ thin film 92 is formed by nitriding the surface of a SiO$_2$ film.

A TiSiN film may be formed either the foregoing thermal CVD process or a plasma CVD process, which will be described later. A TiSiN film has an excellent barrier property regardless of the TiSiN film forming process.

A TiSiN film formed by either a thermal CVD process or a plasma CVD process is superior in step coverage to a film formed by a conventional PVD process. Thus, the TiSiN film of the present invention facilitates the miniaturization of semiconductor devices. A TiSiN film formed by a thermal CVD process has particularly excellent step coverage.

Although a TiSiN film formed by a plasma CVD process is inferior in step coverage to that formed by a thermal CVD process, the plasma CVD can be carried out at a process temperature lower than that of the thermal CVD process. Accordingly, when a Cu layer underlies a TiSiN layer, the plasma CVD process is advantageous in view of limiting the diffusion of Cu into the TiSiN film to the least extent.

TiSiN Film Formation by Plasma CVD Process

Figure 13:
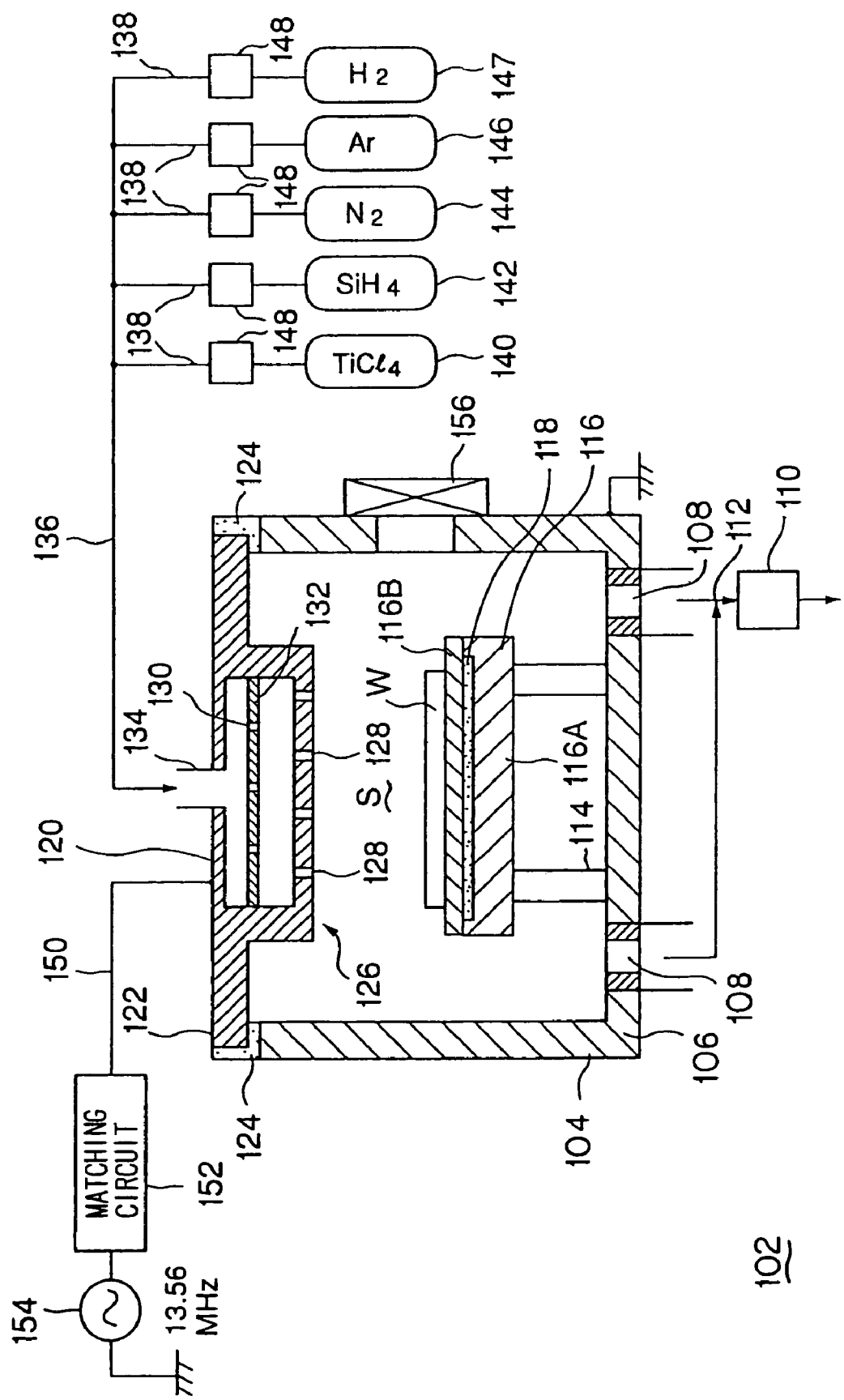
FIG. 13 is a typical sectional view of a plasma film forming system for forming a TiSiN film.

Formation of a TiSiN film by a plasma CVD process will be described hereinafter. FIG. 13 is a schematic view of a plasma film-forming system 102 for forming a TiSiN film.

The plasma film-forming system 102 includes a cylindrical vessel 104 of, for example, a stainless steel. The vessel 104 is grounded. The bottom wall 106 of the vessel 104 is provided with exhaust openings 108 through which the atmosphere in the vessel 104 is exhausted. An exhaust system 112 provided with a vacuum pump 110 is connected to the exhaust openings 108 to exhaust the atmosphere of the vessel 104 uniformly through peripheral parts of the bottom wall 106. A susceptor 116 having the shape of a disk is supported on supports 114 of a conductive material. A workpiece, such as a semiconductor wafer W, is placed on the susceptor 116. The susceptor 116 serves also as a lower electrode. The susceptor 116 comprises a lower part 116A supported on the supports 114, and an upper part 116B joined to the upper surface of the lower part 116A. A resistance heater 118 is sandwiched between the lower part 116A and the upper part 116B. The lower part 116A and the upper part 116B are joined together by, for example, welding.

A top plate 122 integrally provided with a showerhead 120 serving also as an upper electrode is joined hermetically to the side wall of the vessel 104. An insulating member 124 is held between the top plate 122 and the side wall of the vessel 104. The shower head 120 is disposed opposite to the susceptor 116 so as to correspond to the substantially entire upper surface of the susceptor 116 and to define a processing space S between the susceptor 116 and the showerhead 120. The showerhead 120 sprays a plurality of kinds of gases into the processing space S. The showerhead 120 has a lower wall 126 provided with a plurality of gas discharge holes 128. A diffusion plate 132 provided with a plurality of holes 130 is disposed in the showerhead 120 to diffuse gases.

A gas inlet port 134 is formed in the upper wall of the showerhead 120, and a gas supply line 136 is connected to the gas inlet port 134. Branch lines 138 branching from the supply line 136 are connected to a TiCl$_4$ supply 140 storing TiCl$_4$, i.e., a Ti-containing gas, a Silane supply 142 storing silane gas (SiH$_4$ gas), i.e., a silicon hydride gas, a N$_2$ gas supply 144 storing N$_2$ gas, an Ar gas supply 146 storing Ar gas, i.e., a plasma-producing gas, and a H$_2$ gas supply 147 storing H$_2$ gas, i.e., an additive gas (reducing gas), respectively. The branch lines 138 are provided with, for example, mass-flow controllers 148, i.e., flow controllers, respectively. The flows of those gases in the branch lines 138 are controlled by the mass-flow controllers 148, respectively. The silicon hydride gas is not limited to silane gas and may be disilane gas or dichlorosilane gas. NH$_3$ gas may be used as the reducing gas.

A plasma-producing radio-frequency power source 154 of a predetermined frequency of, for example, 13.56 MHz and a matching circuit 152 are connected to the top plate 122 by a lead 150 to produce a plasma when a TiSiN film is formed. A gate valve 158 is attached to the side wall of the vessel 104 to close the vessel 104 hermetically. A wafer is carried into and carried out of the vessel 104 through the gate valve 158. The susceptor 116 is provided with wafer lifting pins, not shown, to raise or lower a wafer when the wafer is placed on and when the wafer is carried away from the susceptor 116.

Figure 14:
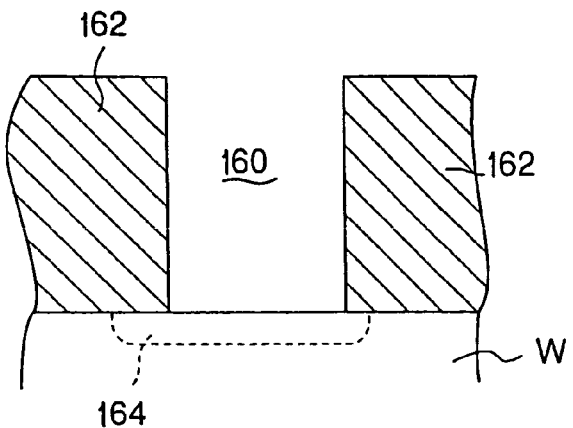
FIGS. 14(A), 14(B) and 14(C) are sectional views of assistance in explaining a method of forming a barrier layer of a TiSiN film, and a copper layer in a contact hole.
Figure 14:
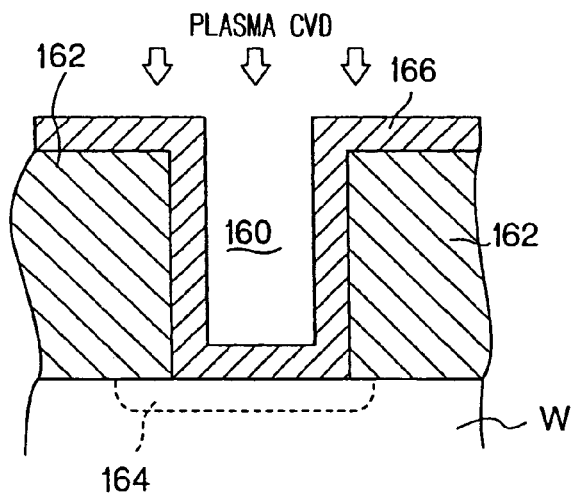
Figure 14:
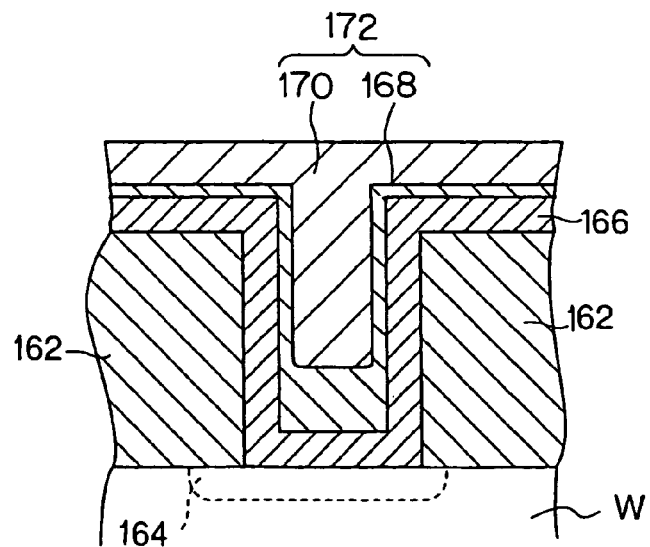

A method of forming a barrier metal layer of a TiSiN film and a wiring layer 172 on a semiconductor wafer W provided with a layer insulating film 162 and contact holes 160 will be described with reference to FIGS. 13 and 14.

The gate valve 156 is opened, the semiconductor wafer W is carried through the gate valve 156 into the vessel 104, the semiconductor wafer W is placed on the susceptor 116, and the gate valve 156 is closed to close the vessel 104. As shown in FIG. 14(A), the layer insulating film 162 is formed on a surface of the wafer W by the preceding process. The contact holes 160 for contacts to be connected to a transistor to be formed on the wafer W are formed previously in the layer insulating film 162.

After the vessel 104 has been closed, source gases, i.e., SiH$_4$ gas, N$_2$ gas, and TiCl$_4$ gas, Ar gas, i.e., a plasma-producing gas, and H$_2$ gas, i.e., an additive gas, are introduced at predetermined flow rates, respectively, through the showerhead 120 into the vessel 104. The vessel 104 is evacuated by the vacuum pump 110 to maintain the interior of the vessel 104 at a predetermined pressure. Since TiCl$_4$ is in a liquid phase at ordinary temperatures, TiCl$_4$ is heated for gasification to supply TiCl$_4$ gas into the vessel 104. The TiCl$_4$ supply 140, the gas supply line extending between the TiCl$_4$ gas supply 140 and the vessel 104, and the mass-flow controller 148 are heated by a heating means, not shown, to prevent the condensation of TiCl$_4$ gas. The top plate 122 and the side wall of the vessel 104 are also heated.

On the other hand, the radio-frequency power source 154 applies radio-frequency power of 13.56 MHz to the showerhead 120 serving also as an upper electrode to create a radio-frequency electric field between the showerhead 120 and the susceptor 116 serving also as a lower electrode. Consequently, Ar gas is ionized to produce an Ar plasma, thereby $TiCl_4$ gas, $H_2$ gas, $SiH_4$ gas and $N_2$ gas interact. Consequently, a TiSiN film is deposited on the surface of the wafer W by a plasma CVD process. The wafer W is maintained at a predetermined temperature by the resistance heater 118 embedded in the susceptor 116.

Preferable Process Conditions are as follows:
Wafer temperature: 350 to 450° C.
Process pressure: 0.5 to 5 Torr
Frequency of radio-frequency power: 13.56 MHz
Radio-frequency power: 200 to 800 W
$TiCl_4$ gas flow rate: 1 to 10 sccm
$H_2$ gas flow rate: 100 to 3000 sccm
Ar gas flow rate: 100 to 2000 sccm
$N_2$ gas flow rate: 30 to 500 sccm
$SiH_4$ gas flow rate: 0.1 to 10 sccm The Cl-concentration of the TiSiN film is high and a Cu layer overlying a TiSiN film is corroded when the wafer temperature is lower than 350° C. When the wafer temperature is higher than 450° C. and a Cu layer underlies a TiSiN film, Cu diffuses into the TiSiN film during a Cu film forming process to deteriorate the barrier property of the TiSiN film. Therefore, a suitable wafer temperature is in the range of 350 to 450° C. Other process conditions will be explained in detail in connection with experiments which will be described later.

FIG. 14(A) is an enlarged sectional view of one of the contact holes 160 formed in the surface of the semiconductor wafer W before the formation of a TiSiN film. The surface of a diffused region 164 formed in the surface of the wafer W is exposed in the contact hole 160 at the bottom thereof. The wafer W is a single-crystal silicon wafer. The diffused layer 164 is a Si layer or a Si-containing layer.

The wafer W is subjected to a plasma CVD process under the foregoing process conditions. As shown in FIG. 14(B), a TiSiN film (titanium silicon nitride film) 166 is formed on the side surface and the bottom of the contact hole 160, as well as on the upper surface of the wafer W.

After the TiSiN film of a predetermined thickness has been formed by the plasma CVD process, the wafer W is transferred to another film forming system to deposit a thin first Cu layer 168 as a seed layer is formed by, for example, by an ordinary CVD process to reduce the aspect ratio of the contact hole 160. Subsequently, a second Cu layer 170 is deposited on the surface of the layer insulating film 162 so as to fill up the contact hole 160 to form a wiring layer 172 as shown in FIG. 14(C).

The TiSiN film 166 interposed as a barrier layer between the diffused region 164, i.e., a Si layer or a Si-containing layer, and the Cu layer 168 functions effectively as a barrier to prevent the diffusion of Si into the Cu layer 168 and the diffusion of Cu into the diffused region 164. A TiSiN film having an excellent barrier property and a resistivity, such as a resistivity in the range of 500 to 5000 $\mu\Omega\cdot cm$, required by the current or the future design rule can be formed by properly determining the composition of the TiSiN film 166.

A preferable composition of a TiSiN film having a resistivity in the foregoing range has a Ti-content in the range of 10 to 40 atomic percent, a Si-content in the range of 10 to 40 atomic percent and a N-content in the range of 25 to 47 atomic percent.

It is preferable to form a Ti film or a titanium silicide film before forming the TiSiN film 166. The resistivity can be reduced to about 100 $\mu\Omega\cdot cm$ by forming a Ti film or a titanium silicide film under the TiSiN film 166.

Figure 15:
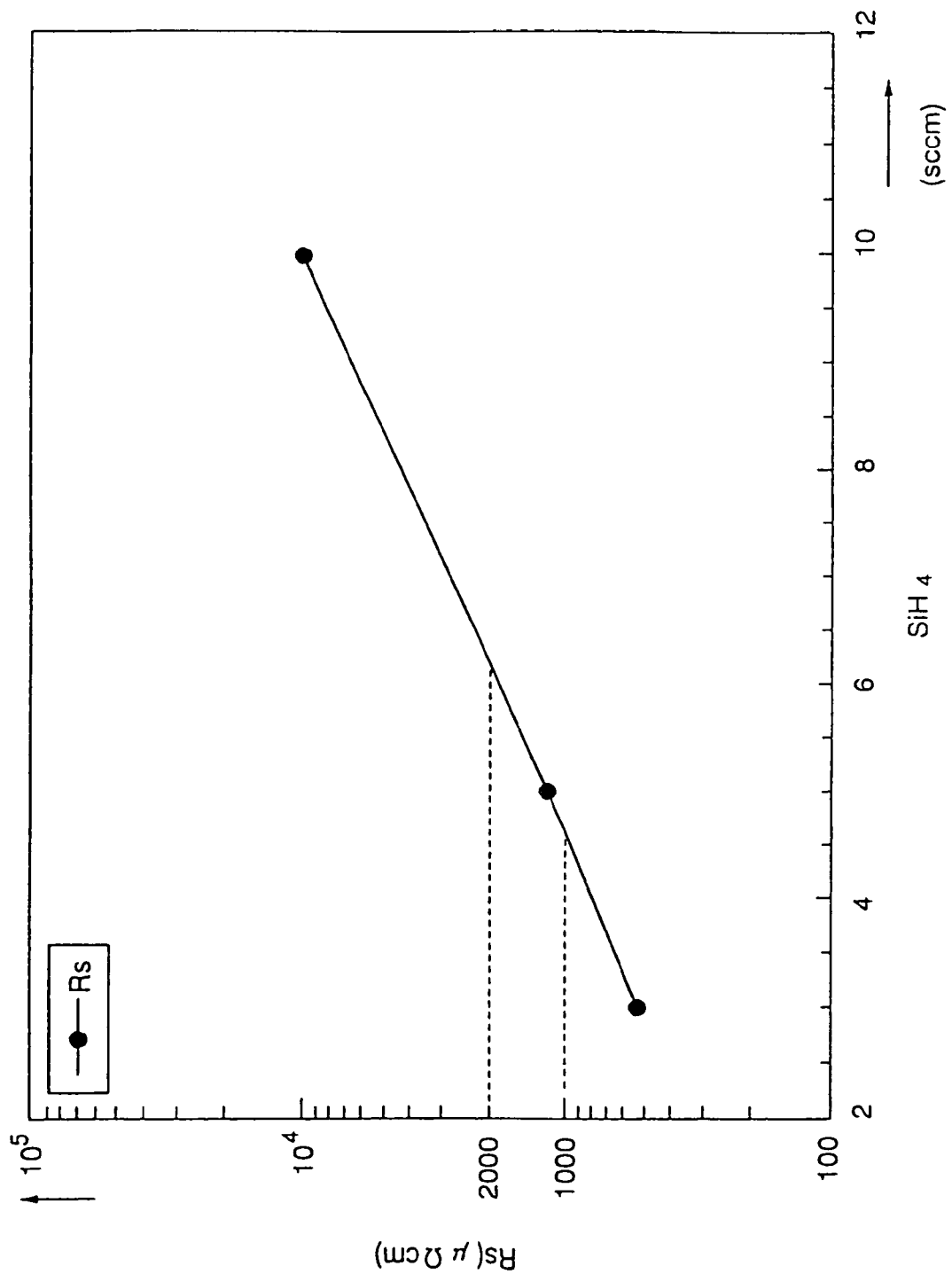
FIG. 15 is a graph showing the dependence of resistivity Rs on the flow rate of $SiH_4$ gas.
Figure 16:
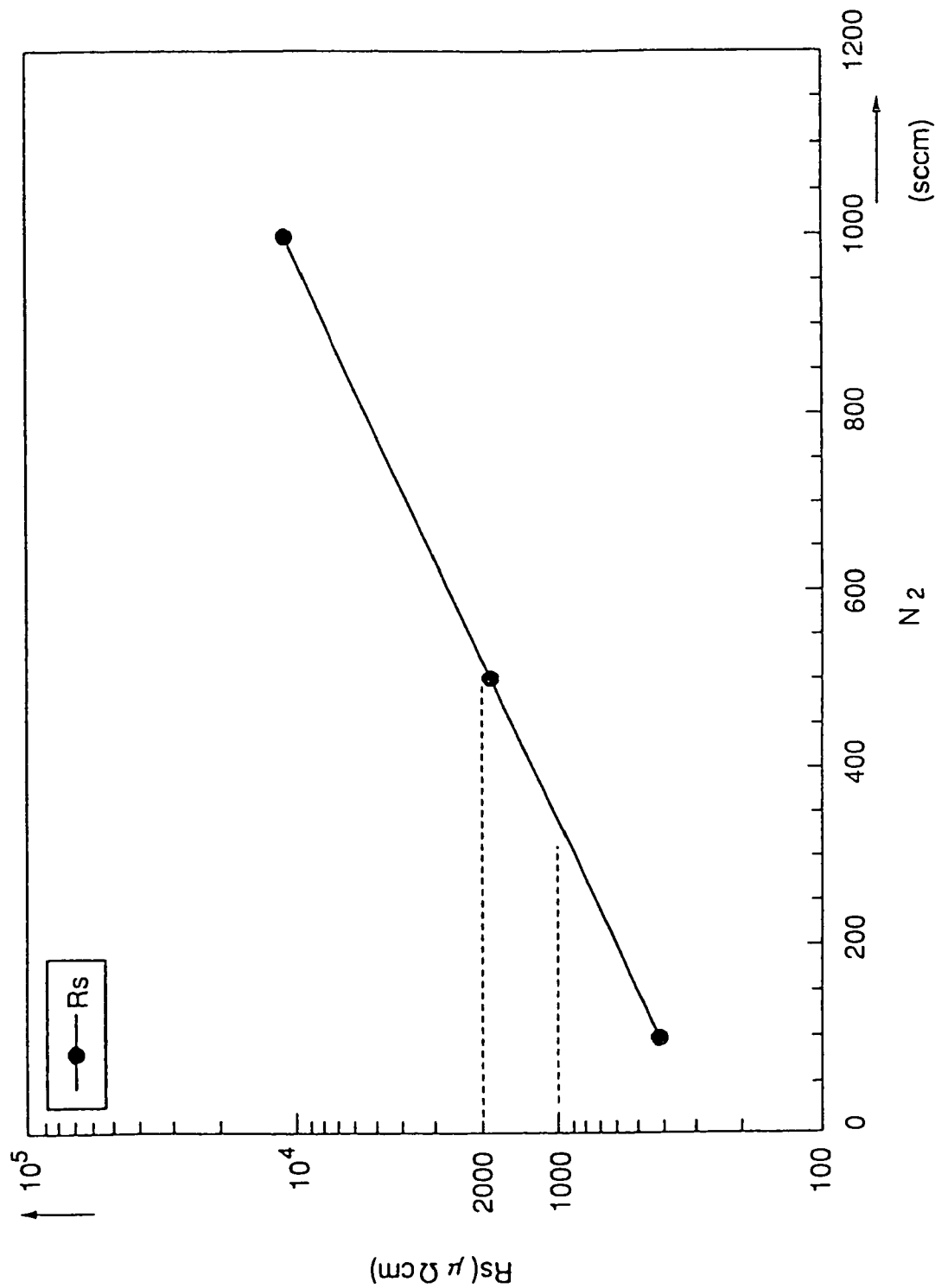
FIG. 16 is a graph showing the dependence of resistivity Rs on the flow rate of $N_2$ gas.
Figure 17:
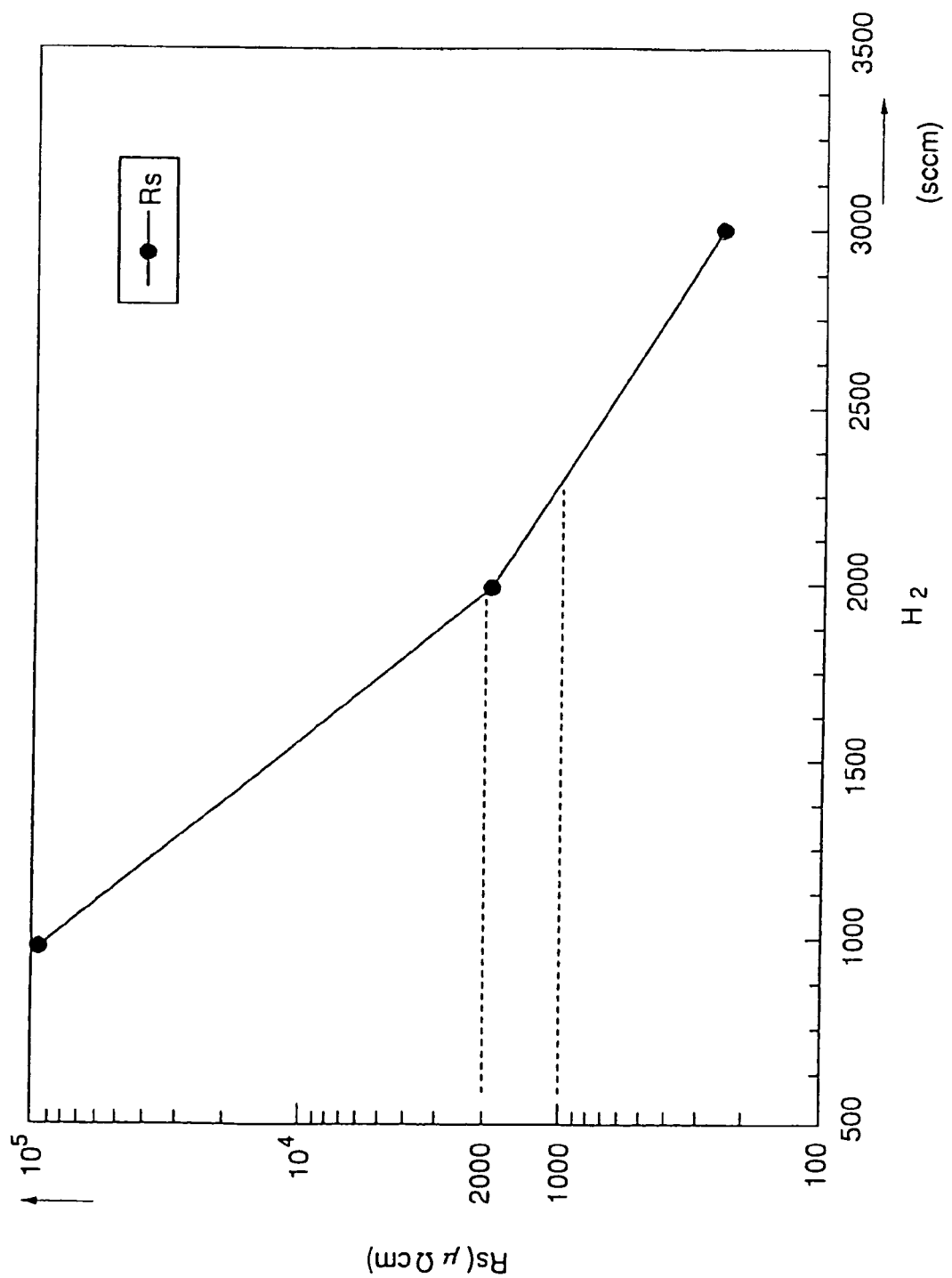
FIG. 17 is a graph showing the dependence of resistivity Rs on the flow rate of $H_2$ gas.

The composition of the TiSiN film can be changed by changing the flow rate of at least one of $SiH_4$ gas, $N_2$ gas and $H_2$ gas, which will be described hereinafter. FIG. 15 is a graph showing the dependence of the resistivity Rs of the TiSiN film on the flow rate of $SiH_4$ gas, FIG. 16 is a graph showing the dependence of the resistivity Rs of the TiSiN film on the flow rate of $N_2$ gas, and FIG. 17 is a graph showing the dependence of the resistivity Rs of the TiSiN film on the flow rate of $H_2$ gas.

As obvious from those graphs, the resistivity RS of the TiSiN film can be increased by increasing the flow rate of silane gas ($SiH_4$ gas) or $N_2$ gas or by reducing the flow rate of $H_2$ gas. Thus, a TiSiN film having a resistivity in the range of 500 to 5000 $\mu\Omega\cdot cm$ can be easily formed. The flow rates of other gases were fixed at fixed values within the foregoing flow rate ranges during operations for obtaining the graphs shown in FIGS. 15 to 17.

When the flow rate of $H_2$ gas or $N_2$ gas is changed to adjust the resistivity, the flow rates of other gases must be changed accordingly. On the contrary, when the flow rate of $SiH_4$ gas is changed, the flow rates of other gases do not need to be changed, which facilitates operation and control.

A further description will be made in connection with experiments.

Experiment 1

TiSiN film forming experiments were conducted under the following process conditions (film-deposition conditions).

Wafer temperature: 400° C. (Fixed)
Pressure: 1 Torr, 3 Torr
Flow rate of $TiCl_4$ gas: 10 sccm (Fixed)
Flow rate of $H_2$ gas: 1000 sccm, 2000 sccm
Flow rate of Ar gas: 100 sccm, 500 sccm, 1000 sccm
Flow rate of $N_2$ gas: 100 sccm, 2000 sccm, 500 sccm
Flow rate of $SiH_4$ gas: 0 sccm, 1 sccm, 2 sccm, 5 sccm
Radio-frequency power: 200W, 500 W
Frequency of radio-frequency power: 13.56 MHz (Fixed)

The following are suitable process conditions for forming a TiSiN film satisfactory in Cl-content and resistivity selected from the foregoing process conditions.

Wafer temperature: 400° C.
Pressure: 3 Torr
Flow rate of $TiCl_4$ gas: 10 sccm
Flow rate of $H_2$ gas: 2000 sccm
Flow rate of Ar gas: 100 sccm
Flow rate of $N_2$ gas: 500 sccm
Flow rate of $SiH_4$ gas: 5 sccm
Radio-frequency power: 500 W
Frequency of radio-frequency power: 13.56 MHz A satisfactory TiSiN film having a Cl-content of 6.7 atomic percent and a resistivity of 1880 $\mu\Omega\cdot cm$ could be formed under the those selected process conditions. It was decided to use those selected process conditions as standard film forming conditions (STD conditions).

In this case, the TiSiN film had a Ti-content of 30 atomic percent, a Si-content of 23 atomic percent and a N-content of 31 atomic percent. Step coverage was 20% when A/R=3 (where A is the diameter of a hole equal to 0.6 μm, and R is the depth of the hole equal to 1.8 μm), and was 13% when A/R=4.

Figure 18:
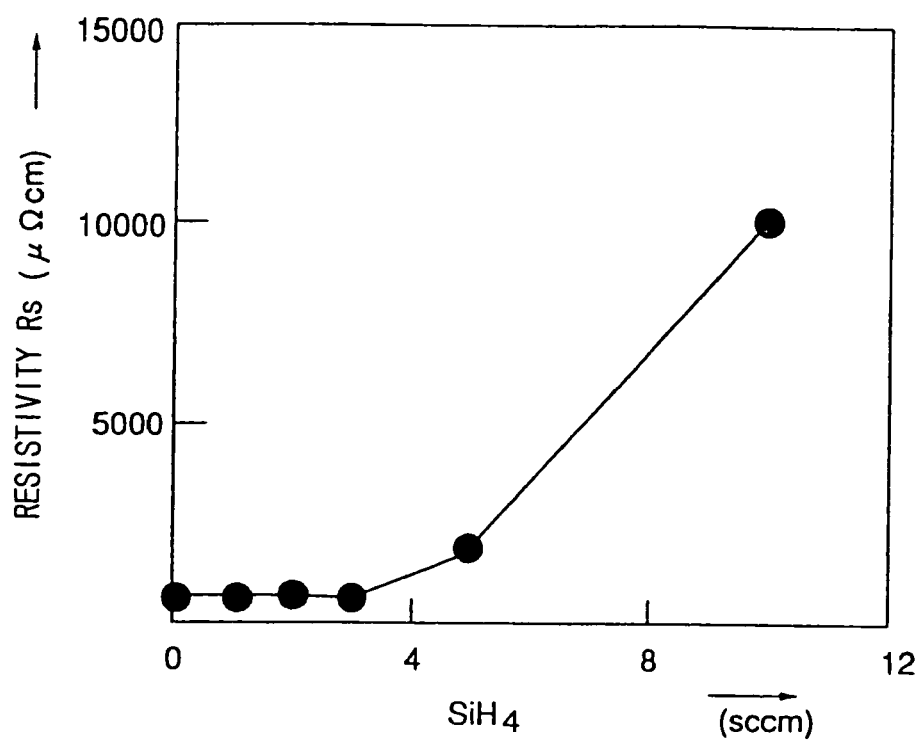
FIG. 18 is a graph minutely showing the relation between the flow rate of $SiH_4$ shown in FIG. 15, and the resistivity of a TiSiN film.
Figure 19:
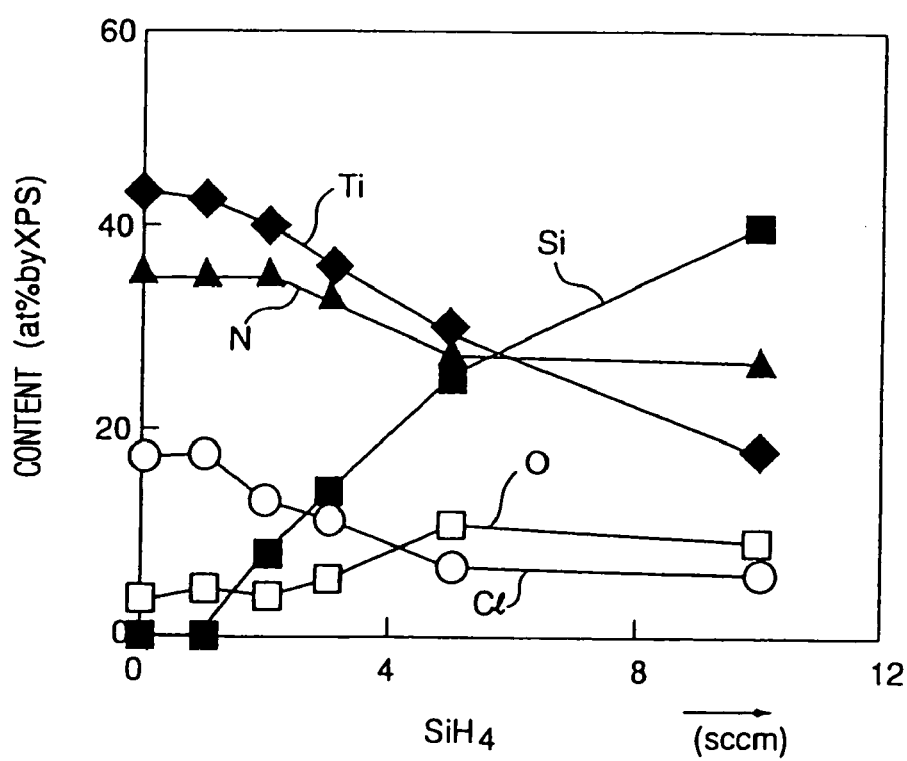
FIG. 19 is a graph showing the relation between the flow rate of $SiH_4$ gas and the composition of a TiSiN film formed by a high-pressure process.

FIG. 18 is a graph minutely showing the relation between the flow rate of $SiH_4$ shown in FIG. 15 and the resistivity of the TiSiN film, and FIG. 19 is a graph showing the relation between the flow rate of $SiH_4$ gas and the composition of a TiSiN film. Note that the vertical axis of the graph shown in FIG. 18 is not graduated on a log scale and is graduated normally.

A film forming experiment for obtaining data shown in FIGS. 18 and 19 were conducted under the foregoing standard process conditions, except that the flow rate of SiH$_4$ gas was varied in the range of 1 to 10 sccm. The resistivities of TiSiN films thus formed were in the range of 500 to 10000 μΩ·cm.

As shown in FIG. 19, the Si-content increased and the Ti-content and the N-content decreased with the increase of the flow rate of SiH$_4$ gas. It is inferred that the increase of resistivity with the increase of the flow rate of SiH$_4$ gas is attributable to the increase of S—N bonds in the TiSiN film.

Figure 20:
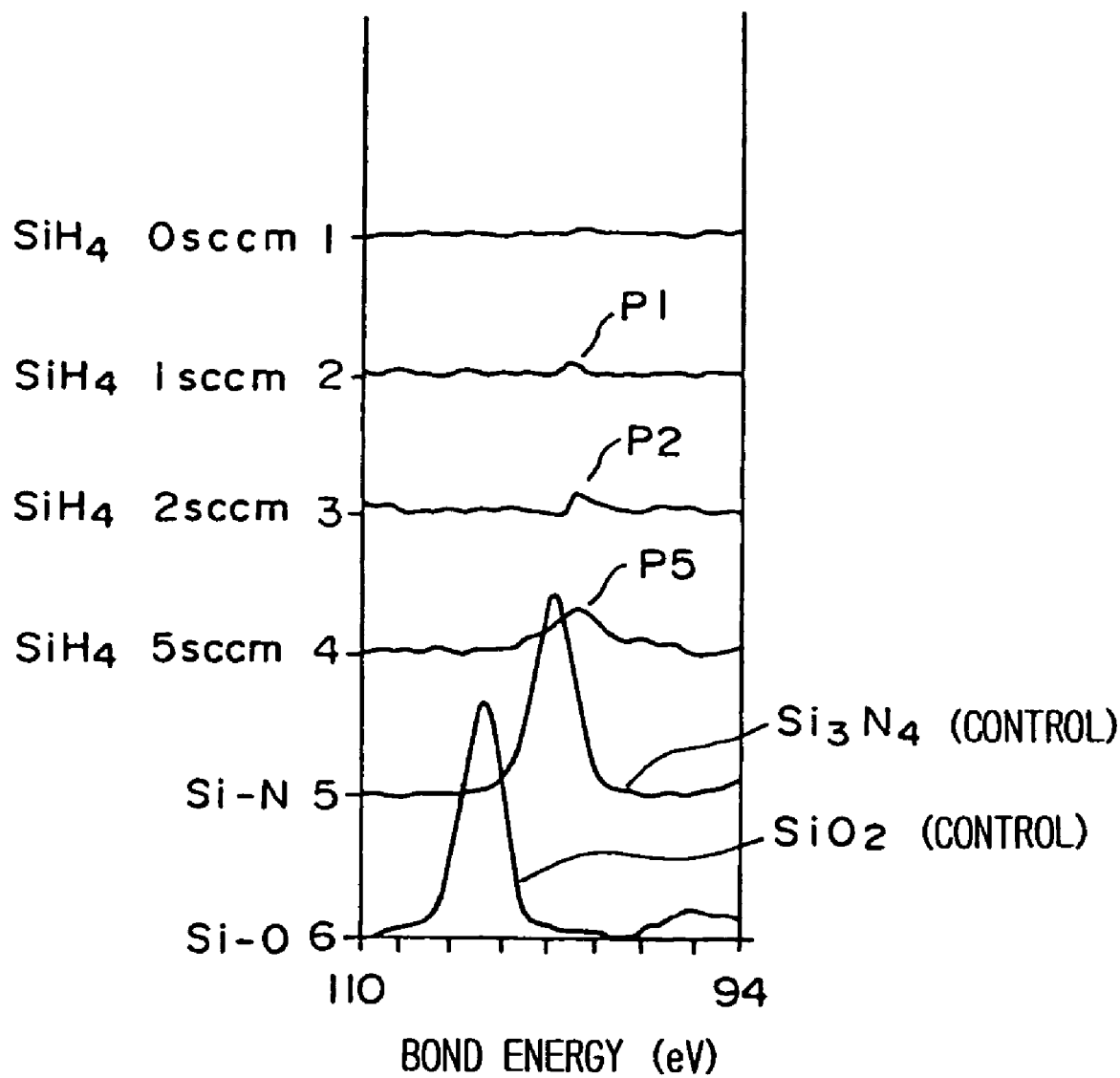
FIG. 20 is graph showing the state of S—N bonds in a TiSiN film.

TiSiN films were formed under the standard process conditions except for the flow rate of SiH$_4$ gas being changed among 0, 1, 2 and 5 sccm to examine the condition of S—N bonds in the TiSiN films. Data shown in FIG. 20 was obtained by ESCA (electron spectroscopy analyzer). FIG. 20 includes data on thermal silicon nitride film (Si$_3$N$_4$) as a control sample of Si—N bond and data on a thermal silicon dioxide film (SiO$_2$) as a control sample of Si—O bond. In FIG. 20, bond energy (eV) is measured on the horizontal axis and intensity of photoelectrons is measured on the vertical axis.

As is obvious from FIG. 20, TiSiN films formed by using SiH$_4$ gas have peaks P5, P2 and P1 substantially positionally coinciding with the peak of the Si-N control sample (Si$_3$N$_4$), and the existence of Si—N bonds could be proved. It was also provided that the higher the flow rate of SiH$_4$ gas, the greater is the peak value and the greater is the amount of Si—N bonds. The peak value is large particularly when the flow rate of SiH$_4$ gas is 5 sccm.

The TiSiN films formed under the foregoing process conditions were examined for amorphousness by x-ray diffraction. The results of examination are shown in FIG. 21, in which diffraction angle is measured on the horizontal axis. A sharp peak of TiN (200) orientation is expected to appear in the range of 30° to 60° if the TiSiN film is crystalline. Any peaks were not found in the films and it was found that all the films are amorphous. Since the TiSiN films are not crystalline and are amorphous, the TiSiN films having high barrier capability can be formed without significantly increasing resistivity.

Results of evaluation of the barrier property of a barrier meal layer of a TiSiN film will be given. A TiSiN film of a thickness of 400 or 100 Å was formed on a silicon substrate under the foregoing process conditions (flow rate of SiH$_4$ gas was 5 sccm), a 2000 Å thick Cu film was formed on the TiSiN film, and the TiSiN film and the Cu film were annealed at about 500° C. for 30 min. Then, the diffusion of Cu, Ti and Si was examined.

Figure 22:
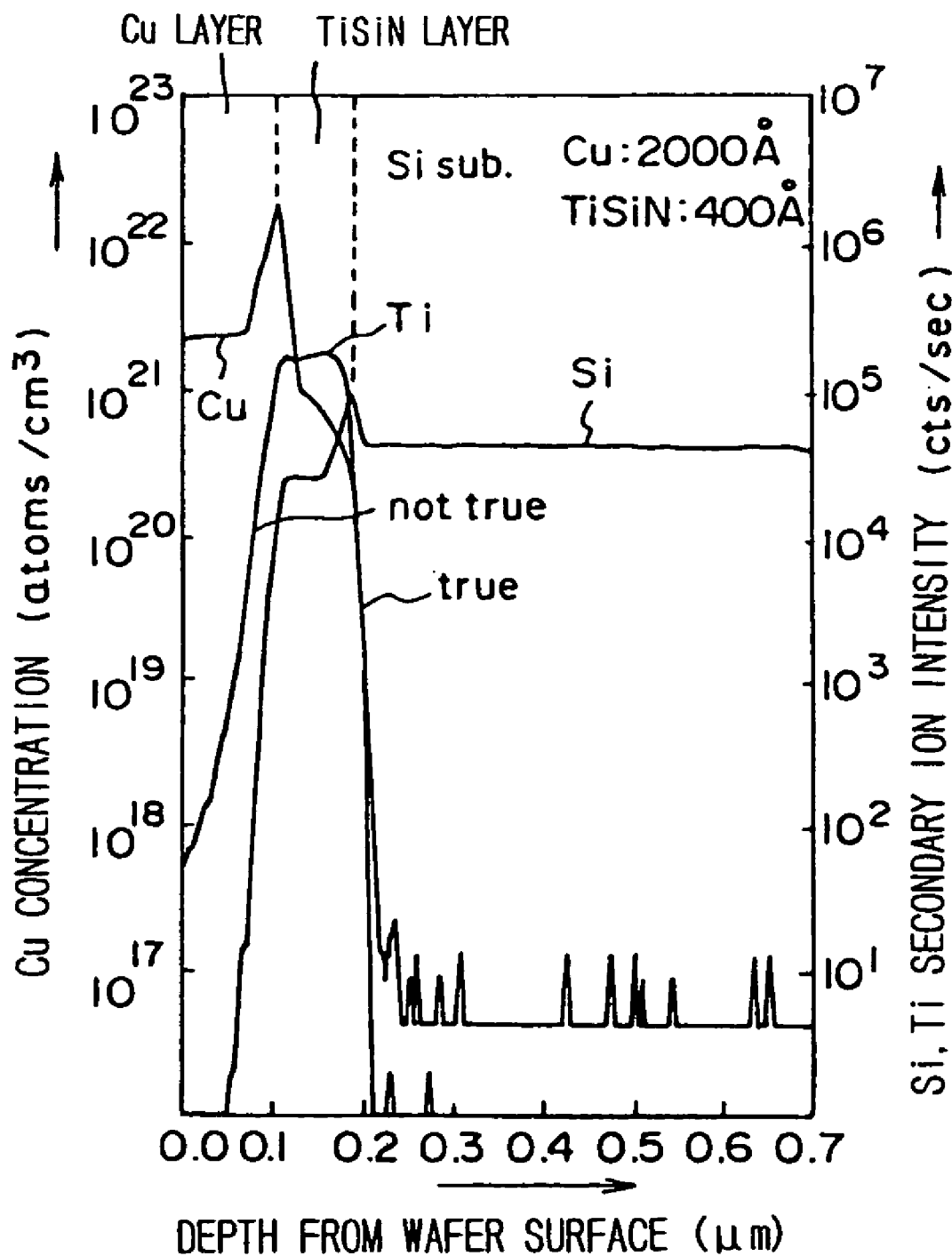
FIG. 22 is a graph showing a mode of diffusion when the thickness of a TiSiN film is 400 Å.

FIG. 22 is a graph showing a mode of diffusion when a TiSiN film has a thickness of 400 Å, in which depth in a Si substrate is measured on the horizontal axis.

As is obvious from Cu-content distribution with respect to a direction along the depth of the Si substrate shown in the graph, Cu diffuses scarcely into the Si side and Si diffuses scarcely into the Cu layer when the thickness of the TiSiN film is 400 Å, which proves the high barrier property of the TiSiN film. The Cu-content distribution measurement was made with a TiSiN film having a thickness on the order of 100 Å. Measured results proved the sufficient barrier property of the TiSiN film. Although Ti seems to have diffused in the Cu layer in the graph due to characteristic errors in the measurements, actually, Ti does not diffuse into the Cu layer. A part including such characteristic errors in the curve is specified by a note "Not true".

Figure 23:
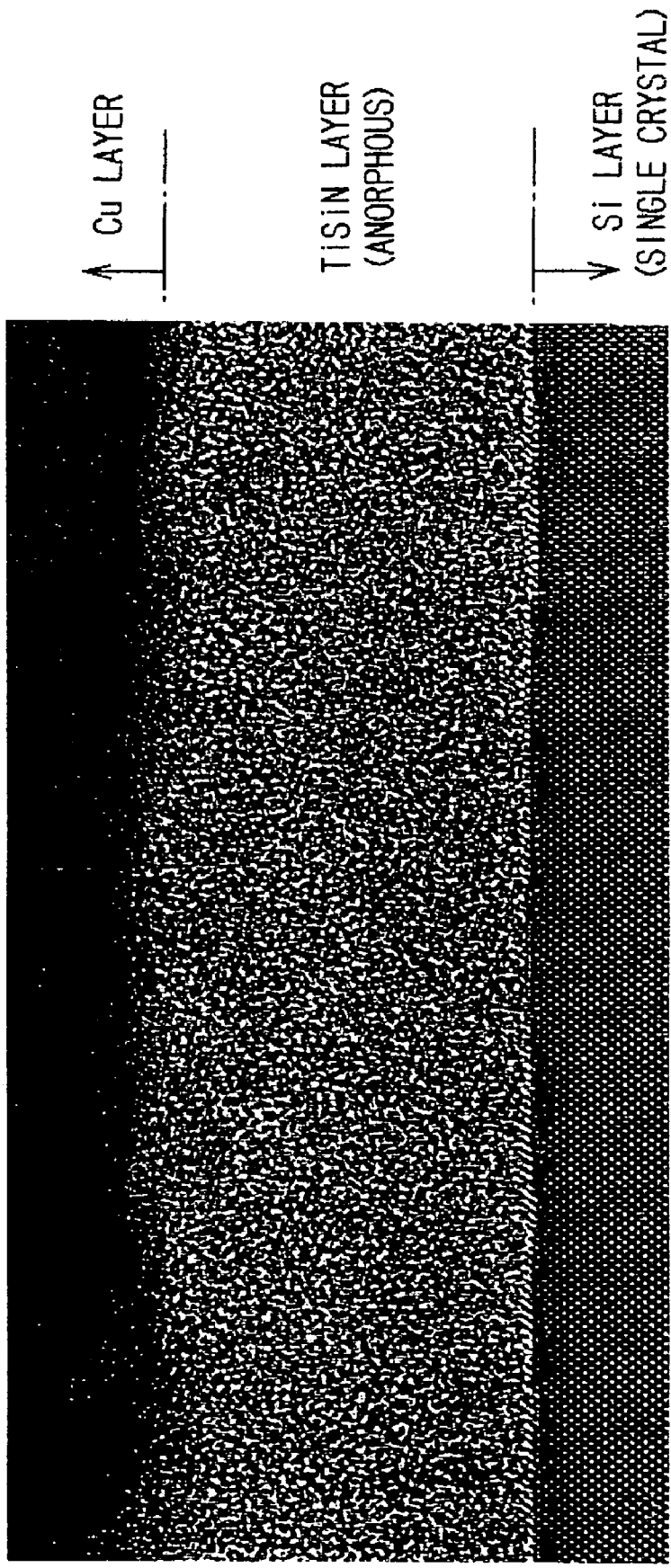
FIG. 23 is a TEM photograph of a section of a 100 Å thick TiSiN film.

FIG. 23 is a TEM (transmission electron microscopy) photograph of a section of a 100 Å thick TiSiN film. As is obvious from the TEM photograph, any arrangement of atoms cannot be found in the TiSiN film, which proves that the TiSiN film is amorphous, any diffusion of Cu through the TiSiN film into the Si side is seen, and condition is satisfactory.

Experiment 2

Experiment was conducted to form a plurality of types of TiSiN films respectively having different compositions by changing process conditions as shown below and to evaluate the heat-resistance of the TiSiN films. Each test sample was prepared by forming a TiSiN film on a Si wafer, and forming a Cu film on the TiSiN film.

Process Conditions 2-a (Identical to the Foregoing STD Conditions)
  Wafer temperature: 400° C.
  Process pressure: 3 Torr
  Flow rate of TiCl$_4$ gas: 10 sccm
  Flow rate of H$_2$ gas: 2000 sccm
  Flow rate of Ar gas: 100 sccm
  Flow rate of N$_2$ gas: 500 sccm
  Flow rate of SiH$_4$ gas: 5 sccm
  Frequency of radio-frequency power: 13.56 MHz
  Radio-frequency power: 500 W Process Conditions 2-b Process conditions 2-b were the same as the process conditions 2-a, except that the flow rate of SiH$_4$ gas was 3 sccm.

Process Conditions 2-c

Process conditions 2-c were the same as the process conditions 2-a, except that the flow rate of SiH$_4$ gas was 5 sccm and process pressure was 3 Torr.

Test samples fabricated under the process conditions 2-a to 2-c were annealed at 600° C. or 700° C., and the compositions of the TiSiN films before annealing and those of the same after annealing were compared. Results are shown in Table 1

TABLE 1

| Process conditions | Status | Composition (atomic percent), (at %) | | | |
|---|---|---|---|---|---|
| | | Ti | Si | N | C |
| 2-a | As formed | 30.4 | 20.9 | 31.9 | 7.4 |
| (STD) | After 600° C. annealing | 31.2 | 21.8 | 28.9 | 7.0 |
| | After 700° C. annealing | 29.0 | 23.1 | 27.9 | 7.2 |
| 2-b | As formed | 29.0 | 19.4 | 39.5 | 3.7 |
| | After 600° C. annealing | 29.7 | 23.0 | 35.4 | 1.5 |
| | After 700° C. annealing | 28.7 | 29.3 | 35.0 | 1.1 |
| 2-c | As formed | 11.3 | 36.2 | 44.8 | 3.4 |
| | After 600° C. annealing | 11.2 | 37.0 | 44.0 | 3.3 |
| | After 700° C. annealing | 10.3 | 37.0 | 43.8 | 2.8 |

As is obvious from Table 1, the N-content of the respective compositions of the TiSiN films of all the test samples fabricated under those process conditions had a tendency to be reduced by annealing due to extraction of N atoms from the TiSiN films by heat, and the Si-content of the same had a tendency to increase due to absorption of Si from the substrate by the TiSiN films. The higher the annealing temperature, the stronger was those tendencies. Those tendencies decreased in order of process conditions 2-b, process conditions 2-a and process conditions 2-c; that is, the heat resistance of the TiSiN film formed under the process conditions 2-c was the highest.

Experiment 3

Experiments were conducted under the following process conditions to confirm the effect of radio-frequency power of 60 MHz on the compositions of TiSiN films.

Process Conditions 3-a

Process conditions 3-a were the same as the process conditions 2-a (STD), except that radio-frequency power of 60 MHz was used.

Process Conditions 3-b

Process conditions 3-b were the same as the process conditions 2-a (STD), except that the process pressure was 1 Torr, the flow rate of $SiH_4$ gas was 7 sccm and radio-frequency power of 60 MHz was used.

The respective compositions of TiSiN films formed under those process conditions are shown in Table 2

TABLE 2

| Process conditions | Composition (atomic percent), (at %) | | | |
| --- | --- | --- | --- | --- |
| | Ti | Si | N | Cl |
| 3-a | 18.9 | 21.3 | 32.2 | 20.5 |
| 3-b | 38.7 | 10.5 | 33.3 | 12.2 |

The film formed under the process conditions 3-a, which differs from the standard process conditions 2-a only in the frequency of the radio-frequency power, had a high resistance (80,200 μΩ·cm) and was found to be unsuitable for use as a barrier layer. Both the TiSiN films formed under the process conditions 3-a and 3-b had a high Cl-content and were found to be unsuitable for use as a barrier layer. The TiSiN film formed under the process conditions had a satisfactory step coverage of 30% when A/R=3.

Experiment 4

Experiments were conducted to find the effect of the flow rate of $N_2$ gas on the composition of a TiSiN film.

Process Conditions 4

Wafer temperature: 400° C.
Process pressure: 3 Torr
Flow rate of $TiCl_4$ gas: 10 sccm
Flow rate of $H_2$ gas: 2000 sccm
Flow rate of Ar gas: 100 sccm
Flow rate of $N_2$ gas: 100 sccm
Flow rate of $SiH_4$ gas: 3, 4 and 5 sccm
Frequency of radio-frequency power: 60 MHz
Radio-frequency power: 500 W The process conditions 4 are the same as the standard process conditions (STD), except that the flow rate 100 sccm of $N_2$ gas is lower than that in the standard process conditions, and the flow rate of $SiH_4$ gas is changed among 3, 4 and 5 sccm. The respective compositions of the TiSiN films respectively formed under the foregoing three sets of process conditions are shown in Table 3.

TABLE 3

| Flow rate of $SiH_4$ | Composition (atomic percent), (at %) | | | |
| --- | --- | --- | --- | --- |
| (sccm) | Ti | Si | N | Cl |
| 3 | 34.0 | 32.6 | 26.7 | 3.4 |
| 4 | 28.5 | 37.6 | 26.6 | 4.1 |
| 5 | 21.8 | 44.5 | 25.1 | 4.6 |

As is obvious from Table 3, the Cl-content of the TiSiN film formed under the process conditions 4 using the flow rate 100 sccm of $N_2$ gas was half that of the TiSiN film formed under the standard process conditions 2-a.

It was found that the Ti-content of the TiSiN film decreases and the Si-content of the same increases with the increase of the flow rate of $SiH_4$ gas, because the reduction of the $N_2$ concentration of the mixture of the source gases promotes a TiSi reaction.

Experiment 5

The flow rate of $SiH_4$ gas was changed among 1, 2, 3, 4 and 5 sccm, and the rest of process conditions were fixed as follows to form TiSiN films Wafer temperature: 400° C.
Process pressure: 3 Torr
Flow rate of $TiCl_4$ gas: 10 sccm
Flow rate of $H_2$ gas: 2000 sccm
Flow rate of Ar gas: 500 sccm
Flow rate of $N_2$ gas: 500 sccm
Frequency of radio-frequency power: 13.56 MHz
Radio-frequency power: 500 W The respective compositions of TiSiN films respectively formed under those three sets of process conditions are shown in Table 4.

TABLE 4

| Flow rate of $SiH_4$ | Composition (atomic percent), (at %) | | | |
| --- | --- | --- | --- | --- |
| (sccm) | Ti | Si | N | Cl |
| 1 | 40.4 | 4.5 | 40.0 | 10.3 |
| 2 | 36.4 | 9.7 | 38.3 | 9.9 |
| 3 | 32.1 | 14.6 | 37.8 | 8.7 |
| 4 | 27.1 | 20.5 | 36.2 | 8.2 |
| 5 | 30.4 | 22.8 | 31.2 | 6.5 |

Increase of the flow rate of $N_2$ gas from that included in the process conditions 4 to 500 sccm, which is equal to that included in the standard process conditions increased the Cl-content of the TiSiN film from 3.4 to 4.6% of the TiSiN films formed under the process conditions 4 to 6.5 to 10.3%. Increase of the flow rate of $SiH_4$ gas could reduce the Cl-content by the reducing effect of $SiH_4$, whereas the Cl-contents of the TiSiN films formed under the process conditions 5 were far greater than that of the TiSiN films formed under the process conditions 4, in which the flow rate of $N_2$ gas was 100 sccm.

Experiment 5A

A 100 Å thick standard TiSiN film, i.e., a TiSiN film formed under the standard process conditions, a 100 Å thick TiSi-rich TiSiN film, a 100 Å thick TiN-rich TiSiN film and a 100 Å thick SiN-rich TiSiN film were formed on Si wafers, respectively.

The standard TiSiN film was formed under the process conditions 2-a (standard process conditions). The TiSi-rich TiSiN film was formed under the process conditions 2-a (standard process conditions), except that the flow rate of $N_2$ gas was changed for 100 sccm. The TiN-rich TiSiN film was formed under the process conditions 2-a, except that the flow rate of $H_2$ gas was changed for 3000 sccm. The SiN-rich TiSiN film was formed under the process conditions 2-a, except that the flow rate of $TiCl_4$ gas was changed for 3 sccm.

Then, 3000 Å Cu films were formed on the TiSiN films, respectively, to obtain test samples by a sputtering process at process pressure of 0.67 Pa and radio-frequency power of 500 W, an inverse sputtering process at 200 W for 2 min, a presputtering process for 5 min, supplying Ar gas at flow rate of 20 sccm and using a Cu target of purity 4N.

Then, the test samples were annealed at 550° C. or 600° C. for 30 min in a vacuum of $5\times10^{-6}$ Torr. The annealing temperature was raised at a raising rate in the range of 10 to 20° C./min and was lowered at a lowering rate in the range of 5 to 10° C./min. Test samples not subjected to annealing were used as comparative samples.

The respective compositions and resistivities of the TiSiN films as deposited, and results of tests of the Cu-barrier properties, i.e., impermeabilities to Cu, of the TiSiN films through annealing are shown in Table 5.

TABLE 5

| | Composition (atomic percent), (at %) | | | | Resistivity ($\mu\Omega \cdot cm$) | Cu-barrier property | |
|---|---|---|---|---|---|---|---|
| | | | | | | Annealing At 550° C. | Annealing At 550° C. |
| | Ti | Si | N | Cl | | | |
| STD | 30.4 | 22.8 | 31.2 | 6.5 | 1676 | Good | Good |
| TiSi-rich | 29.3 | 45.4 | 19.6 | 2.9 | 420 | Good | Bad |
| TiN-rich | 38.1 | 17.4 | 31.8 | 8.6 | 245 | Good | Good |
| SiN-rich | 16.3 | 34.8 | 36.5 | 4.1 | 675000 | Good | Good |

The results of tests of Cu-barrier properties shown in Table 5 can be readily understood by making reference to FIG. 24.

Figure 25:
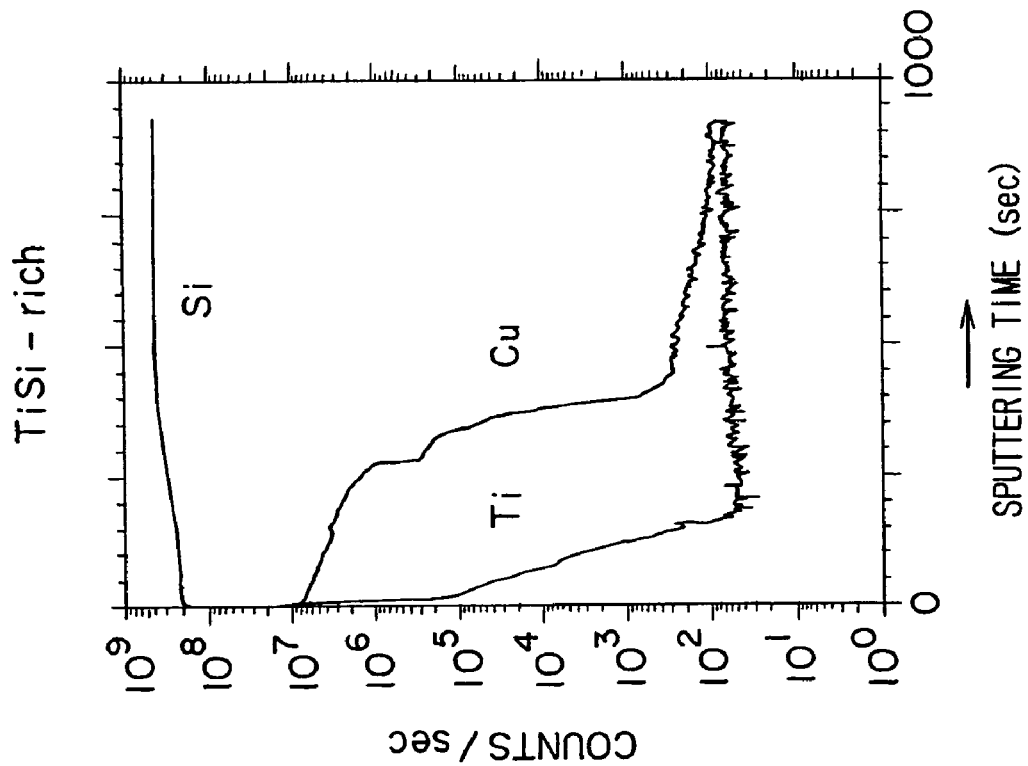
FIGS. 25(A) and 25(B) are graphs comparatively showing the dependence of modes of diffusion on the composition of TiSiN films.
Figure 25:
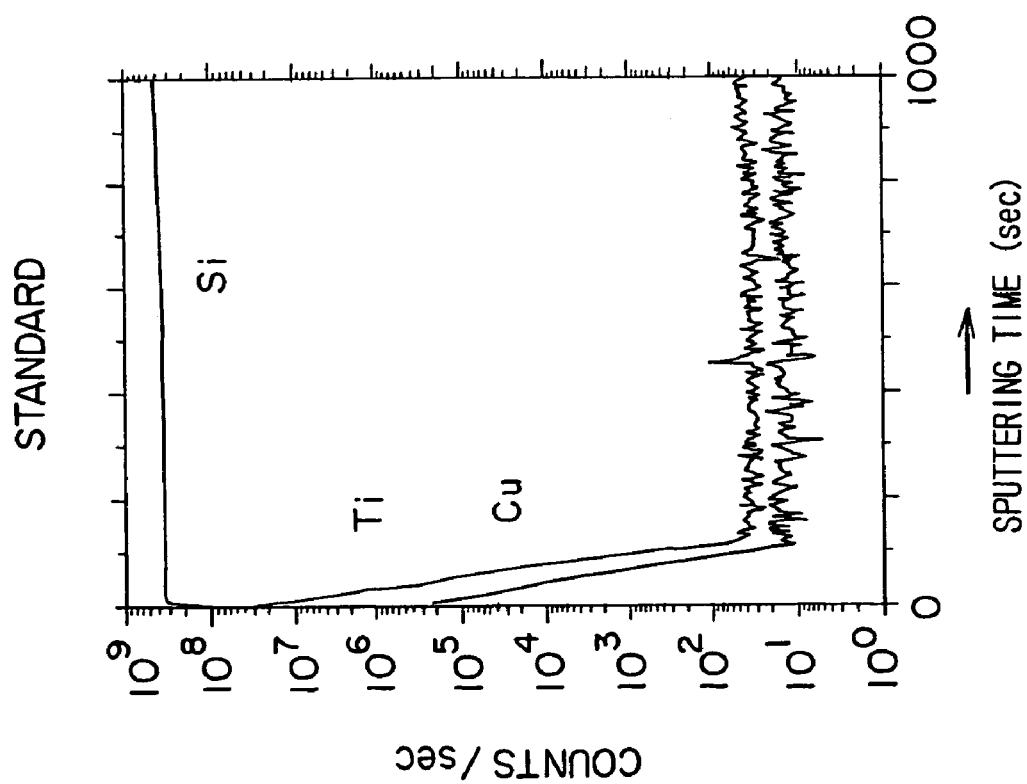
Figure 26:
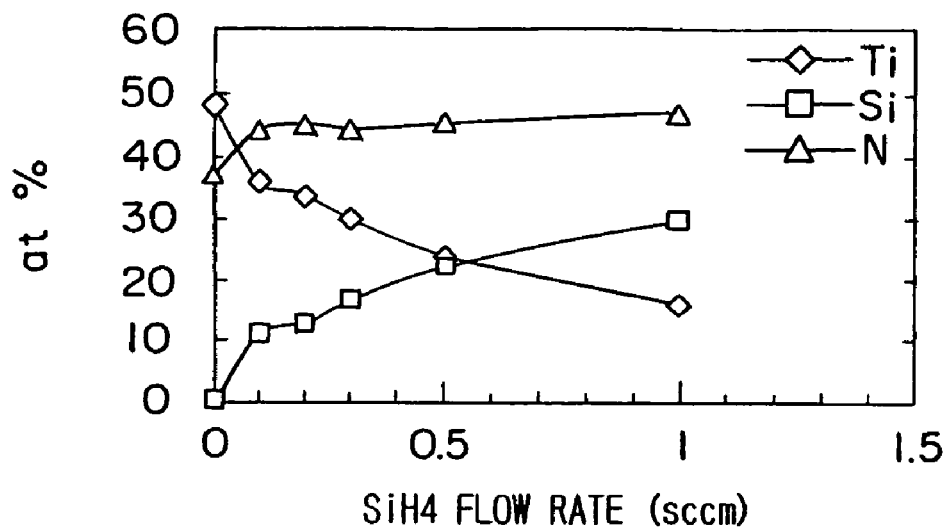
FIG. 26 is a graph showing the dependence of the composition of a TiSiN film on the flow rate of $SiH_4$ gas in a low-pressure process.

The test samples were examined for the state of diffusion of Cu into the Si wafers coated with the standard TiSiN film and the TiSi-rich TiSiN film by SIMS (secondary ion mass spectroscopy). The results of examination are shown in FIGS. 25(A) and 25(B). As is obvious from graphs shown in FIGS. 25(A) and 25(B), the standard TiSiN film prevented the diffusion of Cu into the Si wafer, which demonstrates a satisfactory barrier property. On the other hand, the TiSi-rich TiSiN film permitted the diffusion of Cu into the Si wafer, which demonstrates an unsatisfactory barrier property.

The difference in barrier property between those TiSiN films is considered to be due to the following reasons. Cu diffuses in a grain boundary diffusion mode and a transgranular diffusion mode, and diffusion in the grain boundary diffusion mode is dominant. It is considered that, whereas the TiSi-rich TiSiN film is crystallized by annealing and the crystallized TiSi-rich TiSiN film facilitates grain boundary diffusion, the amorphous standard TiSiN film makes Cu diffusion difficult.

It is known from the results of the experiment that preferable process conditions for forming a TiSiN film having a satisfactory Cu-barrier property at a process pressure of 3 Torr are as follows.

Wafer temperature: 400° C.
Flow rate of $TiCl_4$ gas: 10 sccm
Flow rate of $H_2$ gas: 2000 sccm
Flow rate of Ar gas: 100 sccm
Flow rate of $N_2$ gas: 500 sccm
Frequency of radio-frequency power: 13.56 MHz
Radio-frequency power: 500 W It was found that a preferable flow rate of $SiH_4$ gas is in the range of 1 to 10 sccm, most preferably, 5 sccm.

From the viewpoint of Cu-barrier property, a preferable TiSiN film has a Ti-content in the range of 28 to 31 atomic percent, a Si-content in the range of 20 to 25 atomic percent and a N-content in the range of 28 to 32 atomic percent. It was found that an optimum TiSiN film has a Ti-content of 30 atomic percent, a Si-content of 23 atomic percent and a N-content of 31 atomic percent.

Experiment 6

The effect of reduction of the process pressure to 0.6 Torr on the composition of a TiSiN film was examined.

Process Conditions 6-a
Wafer temperature: 400° C.
Process pressure: 0.6 Torr
Flow rate of $TiCl_4$ gas: 2 sccm
Flow rate of $H_2$ gas: 500 sccm
Flow rate of Ar gas: 50 sccm
Flow rate of $N_2$ gas: 50 sccm
Flow rate of $SiH_4$ gas: 0.1, 0.2, 0.3, 0.5 and 1.0 sccm
Frequency of radio-frequency power: 13.56 MHz
Radio-frequency power: 500 W Measured data on TiSiN films formed under the process conditions 6-a are shown in Table 6

TABLE 6

| Flow rate of $SiH_4$ (sccm) | Composition (atomic percent), (at %) | | | | Resistivity ($\mu\Omega \cdot cm$) | Remarks |
|---|---|---|---|---|---|---|
| | Ti | Si | N | Cl | | |
| 0 | 48.6 | — | 37.4 | 3.6 | 593 | |
| 0.1 | 36.2 | 11.6 | 44.5 | 2.5 | 1313 | |
| 0.2 | 33.9 | 13.0 | 45.2 | 3.0 | 1994 | Step cpverage = 40% (A/R = 4) |
| 0.3 | 30.2 | 16.7 | 44.7 | 3.0 | 3380 | |
| 0.5 | 24.1 | 22.3 | 45.7 | 3.2 | 8268 | |
| 1.0 | 16.2 | 29.8 | 47.2 | 3.6 | 274000 | |

Process Conditions 6-b

Process conditions 6-b are the same as the process conditions 6-a, except that the flow rate of $N_2$ gas was changed among 30, 40, 50 and 80 sccm and the flow rate of $SiH_4$ gas was fixed at 0.2 sccm. Measured data on TiSiN films formed under the process conditions 6-b are shown in Table 7

TABLE 7

| Flow rate of $N_2$ (sccm) | Composition (atomic percent), (at %) | | | | Resistivity ($\mu\Omega \cdot cm$) |
|---|---|---|---|---|---|
| | Ti | Si | N | Cl | |
| 30 | 32.3 | 13.8 | 46.3 | 2.8 | 2374 |
| 40 | 33.1 | 13.7 | 46.3 | 2.2 | 2457 |
| 50 | 31.9 | 14.7 | 46.5 | 2.6 | 3029 |
| 80 | 32.1 | 14.6 | 46.1 | 2.5 | 2881 |

Process Conditions 6-c

Process conditions 6-c are the same as the process conditions 6-a, except that the flow rate of $H_2$ gas was changed among 300, 500, 50 and 700 sccm and the flow rate of $SiH_4$ gas was fixed at 0.2 sccm. Measured data on TiSiN films formed under the process conditions 6-c are shown in Table 8.

TABLE 8

| Flow rate of $H_2$ gas (sccm) | Composition (atomic percent), (at %) | | | | Resistivity ($\mu\Omega \cdot cm$) |
|---|---|---|---|---|---|
| | Ti | Si | N | Cl | |
| 300 | 29.6 | 17.3 | 47.4 | 1.9 | 7514 |
| 500 | 31.9 | 14.6 | 46.5 | 2.6 | 3029 |
| 700 | 32.9 | 13.3 | 46.8 | 2.7 | 2772 |

As is obvious from the results of tests, the Cl-content of the TiSiN films could be reduced to 1.9 to 3.0%, and the Cu-barrier properties and step coverage (40% when A/R=4) of the TiSiN films could be improved by reducing the process pressure from a high level of 3 Torr to a low level of 0.6 Torr, and reducing the respective flow rates of $TiCl_4$ gas, Ar gas, $N_2$ gas and $SiH_4$ gas. The Cl-content of the TiSiN films could be reduced to 2% or below by supplying $H_2$ gas at 300 sccm.

Experiment 7

To prepare test samples, 200 Å thick TiSiN films were formed on Si wafers, respectively, under he process conditions 6-a (Flow rate of $SiH_4$: 0.1, 0.2, 0.3 and 0.5 sccm).

Then 3000 Å Cu films were formed on the TiSiN films, respectively, to obtain test samples by a sputtering process at process pressure of 0.67 Pa and radio-frequency power of 500 W, an inverse sputtering process at 200 W for 2 min, a presputtering process for 5 min, supplying Ar gas at flow rate of 20 sccm and using a Cu target of purity 4N.

Then, some of the test samples were processed by an after-plasma process under process conditions including wafer temperature of 400° C., process pressure of 0.6 Torr, $H_2$ gas flow rate of 500 sccm, $N_2$ gas flow rate of 50 sccm, Ar gas flow rate of 50 sccm, radio-frequency power of 500 W of 13.56 MHz.

Then, all the test samples were annealed at 550° C. or 600° C. for 30 min in a vacuum of $5 \times 10^{-6}$ Torr. The annealing temperature was raised at a raising rate in the range of 10 to 20° C./min and was lowered at a lowering rate in the range of 5 to 10° C./min. Test samples not subjected to annealing were used as comparative samples.

Figure 27:
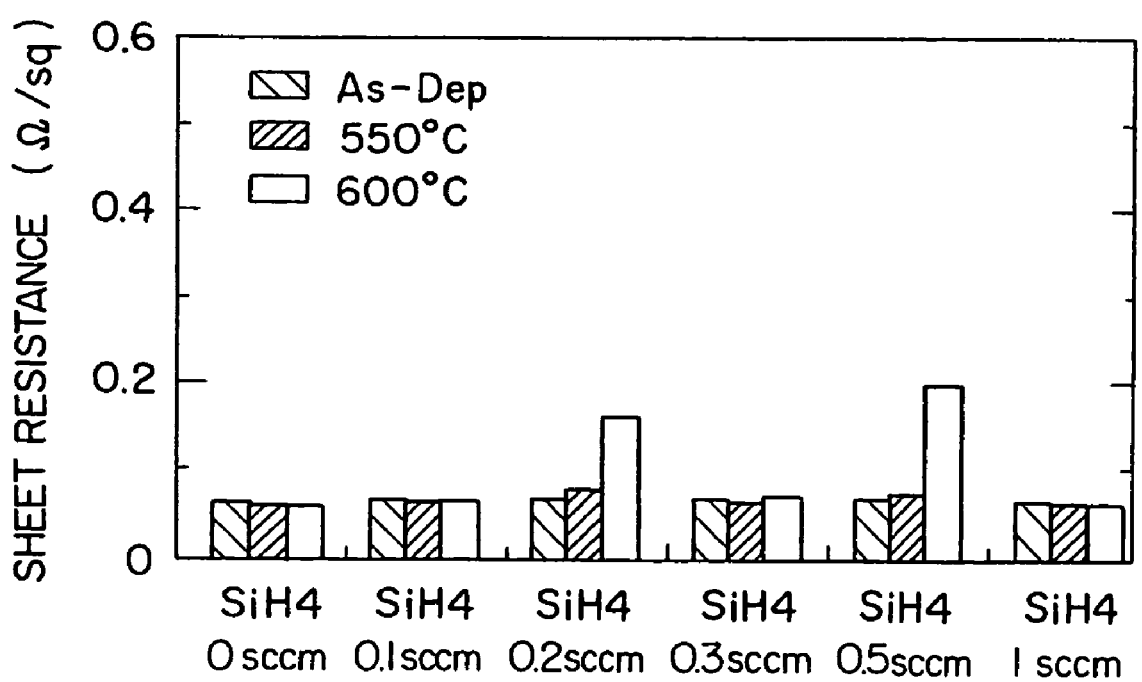
FIG. 27 is a graph showing the dependence of the barrier property of a TiSiN film on the flow rate of $SiH_4$ gas in a low-pressure process.

The respective compositions, corrosion resistances, barrier properties and resistivities of the TiSiN films were examined. The results of examination are shown in FIG. 27 and Table 9.

The TiSiN films formed by supplying $SiH_4$ gas at 0.5 sccm and 1.0 sccm had very high resistivities, and hence those TiSiN films were not suitable for use as a barrier film. The TiSiN films formed by supplying $SiH_4$ gas at 0 sccm had a very high Cl-concentration of 3.6%, and hence those TiSiN films were inferior in corrosion resistance and unsuitable for use as a barrier film.

The TiSiN films formed by supplying $SiH_4$ gas at 0.1 sccm were the best in respect of barrier property, corrosion resistance and electrical resistance.

Somewhat unsatisfactory corrosion resistance of the TiSiN film as deposited could be improved and could make satisfactory by the after-plasma process.

It is known from the results of experiment tabulated in Table 9, when the process pressure is 0.6 Torr (low pressure), preferable process conditions for forming TiSiN films having a satisfactory Cu-barrier property are as follows.

Wafer temperature: 400° C.

Flow rate of $TiCl_4$ gas: 2 sccm

Flow rate of $H_2$ gas: 500 sccm

Flow rate of Ar gas: 50 sccm

Flow rate of $N_2$ gas: 50 sccm

Radio-frequency power: 500 W

Frequency of radio-frequency power: 13.56 MHz

Preferably, the flow rate of $SiH_4$ gas is in the range of 0.1 to 1 sccm, more preferably, in the range of 0.1 to 0.5 sccm, most preferably, in the range of 0.1 to 0.2 sccm.

It was found that a preferable composition of the TiSiN film has a Ti-content in the range of 24 to 36 atomic percent, a Si content in the range of 11 to 22 atomic percent and a N-content in the range of 44 to 46 atomic percent. It was found that an optimum composition has a Ti-content of 34 atomic percent, a Si-content of 13 atomic percent and a N-content of 45 atomic percent.

TABLE 9

| $SiH_4$ flow rate | Composition (atomic percent), (at %) | | | | Corrosion | | | Barrier property | | |
|---|---|---|---|---|---|---|---|---|---|---|
| | | | | | Annealed | Annealed | Plasma-processed and annealed | Annealed | Annealed | Plasma-processed and annealed |
| (sccm) | Ti | Si | N | Cl | at 550° C. | at 600° C. | at 550° C. | at 550° C. | at 600° C. | at 550° C. |
| 0 | 48.6 | — | 37.4 | 3.6 | Corroded | Corroded | Corroded | Good | Good | Good |
| 0.1 | 36.2 | 11.6 | 44.5 | 2.5 | Not corroded | Corroded | Not corroded | Good | Good | Good |
| 0.2 | 33.9 | 13.0 | 45.2 | 3.0 | Not corroded | Not corroded | Not corroded | Bad | Bad | Good |
| 0.3 | 30.2 | 16.7 | 49.7 | 3.0 | Not corroded | Not corroded | Not corroded | Good | Bad | Good |
| 0.5 | 24.1 | 22.3 | 45.7 | 3.3 | Not corroded | Not corroded | Not corroded | Bad | Bad | Good |
| 1.0 | 16.2 | 29.8 | 47.0 | 3.0 | Slightly corroded | Not corroded | Not corroded | Good | Good | Good |

When annealed at 550° C., the barrier properties of the TiSiN films formed by supplying $SiH_4$ gas at 0.2 sccm and 0.5 sccm were unsatisfactory, while those of the TiSiN films formed by supplying $SiH_4$ gas at 0 sccm, 0.1 sccm and 0.3 sccm were satisfactory. When annealed at 600° C., the barrier properties of the TiSiN films formed by supplying $SiH_4$ gas at 0.2 sccm, 0.3 sccm and 0.5 sccm were unsatisfactory, while those of the TiSiN films formed by supplying $SiH_4$ gas at 0 sccm, 0.1 sccm and 1.0 sccm were satisfactory.

The invention claimed is:

1. A method of forming TiSiN-containing film, comprising the steps of:
    placing a substrate into a chamber;
    supplying $SiH_4$ gas, Ti-containing gas, a N-containing gas and a reducing gas into the chamber; and
    depositing a TiSiN-containing film having a resistivity in a range of 500 to 10,000 μΩ cm which contains 10 to 40 atomic percent Ti, 10 to 40 atomic percent Si, and 25 to 47 atomic percent N on the substrate, wherein the SiH$_4$ gas is supplied into the chamber at a flow rate which is less than a flow rate at which the Ti-containing gas is supplied into the chamber.

2. The method according to claim 1 further comprising the steps of:
supplying a gas containing H and N into the chamber;
producing a plasma from the gas containing H and N; and
removing Cl from the TiSiN-containing film by processing a surface of the TiSiN-containing film with the plasma.

3. The method according to claim 1, wherein the TiSiN-containing film is formed on a layer, having been formed on the substrate before forming the TiSiN-containing film, made of a material selected from the group consisting of Si, SiO$_2$, Ti, titanium-silicide, Cu, (Ba, Sr)TiO$_3$, Pb(Zr, Ti)O$_3$, Ta$_2$O$_5$, RuO, Pt, Ru and polysilicon.

4. The method according to claim 1, wherein the substrate is heated at 350 to 450 ° C., and pressure in the chamber is 0.5 to 5 Torr.

5. The method according to claim 1, further comprising a step of cleaning the chamber or members disposed in the chamber with a ClF$_3$-containing gas after the step of forming the TiSiN-containing film on the substrate.

6. The method according to claim 1, wherein the TiSiN-containing film is deposited by a plasma CVD process or a thermal CVD process.

7. The method according to claim 6, wherein the TiSiN-containing film contains 28 to 32 atomic percent Ti, 20 to 25 atomic percent Si, and 28 to 32 atomic percent N.

8. The method according to claim 6, wherein the TiSiN-containing film contains 24 to 36 atomic percent Ti, 11 to 22 atomic percent Si, and 44 to 46 atomic percent N.

9. The method according to claim 6, wherein the TiSiN-containing film is a film for preventing the diffusion of oxygen.

10. The method according to claim 6, wherein the TiSiN-containing film is interposed between a Si layer and a Cu layer.

11. The method according to claim 1, wherein the TiSiN-containing film contains Si-N bonds.

12. The method according to claim 1, wherein the TiSiN-containing film is an amorphous film.

13. The method according to claim 1, wherein TiCl$_4$ is used as the Ti-containing gas, and the TiSiN-containing film contains less than 3.6 atomic percent Cl.

14. The method according to claim 13, further comprising a step of annealing the TiSiN-containing film after deposition thereof.

15. The method according to claim 1, further comprising a step of forming a layer of Pt, Ru or a high-dielectric-constant material on the TiSiN-containing film.

* * * * *